United States Patent
Seo et al.

(10) Patent No.: US 9,343,476 B2
(45) Date of Patent: May 17, 2016

(54) SEMICONDUCTOR DEVICES AND METHODS OF FABRICATING THE SAME

(71) Applicants: YuJeong Seo, Seoul (KR); JinTaek Park, Hwaseong-si (KR); Youngwoo Park, Seoul (KR)

(72) Inventors: YuJeong Seo, Seoul (KR); JinTaek Park, Hwaseong-si (KR); Youngwoo Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/469,611

(22) Filed: Aug. 27, 2014

(65) Prior Publication Data

US 2015/0061155 A1 Mar. 5, 2015

(30) Foreign Application Priority Data

Aug. 28, 2013 (KR) .......................... 10-2013-0102581

(51) Int. Cl.
*H01L 27/115* (2006.01)

(52) U.S. Cl.
CPC .... *H01L 27/11582* (2013.01); *H01L 27/11524* (2013.01); *H01L 2924/0002* (2013.01)

(58) Field of Classification Search
CPC ................... H01L 27/11551; H01L 27/11556; H01L 27/11273
See application file for complete search history.

(56) References Cited

U.S. PATENT DOCUMENTS

| | | | |
|---|---|---|---|
| 7,539,056 B2 | 5/2009 | Katsumata et al. | |
| 7,847,334 B2 | 12/2010 | Katsumata et al. | |
| 8,013,389 B2 | 9/2011 | Oh et al. | |
| 8,048,798 B2 | 11/2011 | Kidoh et al. | |
| 8,278,170 B2 | 10/2012 | Lee et al. | |
| 8,330,208 B2 * | 12/2012 | Alsmeier | H01L 27/11551 257/321 |
| 8,409,977 B2 | 4/2013 | Shim et al. | |
| 8,415,242 B2 | 4/2013 | Mizushima et al. | |
| 8,487,365 B2 | 7/2013 | Sasaki et al. | |
| 2009/0283735 A1 * | 11/2009 | Li et al. | 257/1 |
| 2010/0207193 A1 | 8/2010 | Tanaka et al. | |
| 2012/0003800 A1 * | 1/2012 | Lee | H01L 27/11551 438/261 |

FOREIGN PATENT DOCUMENTS

KR 1020100050790 5/2010

* cited by examiner

*Primary Examiner* — Jae Lee
(74) *Attorney, Agent, or Firm* — Myers Bigel & Sibley, P.A.

(57) ABSTRACT

The inventive concepts provide semiconductor devices and methods of fabricating the same. According to the method, sub-stack structures having a predetermined height and active holes are repeatedly stacked. Thus, cell dispersion may be improved, and various errors such as a not-open error caused in an etching process may be prevented. A grain size of an active pillar used as channels may be increased or maximized using a metal induced lateral crystallization method, so that a cell current may be improved. A formation position of a metal silicide layer including a crystallization inducing metal may be controlled such that a concentration grade of the crystallization inducing metal may be controlled depending on a position within the active pillar.

13 Claims, 38 Drawing Sheets

SEMICONDUCTOR DEVICES AND METHODS OF FABRICATING THE SAME

CROSS-REFERENCE TO RELATED APPLICATION

This U.S. non-provisional patent application claims priority under 35 U.S.C. §119 to Korean Patent Application No. 10-2013-0102581, filed on Aug. 28, 2013, in the Korean Intellectual Property Office, the disclosure of which is hereby incorporated by reference in its entirety.

BACKGROUND

The inventive concepts relate to semiconductor devices and methods of fabricating the same.

A three-dimensional integrated circuit (3D-IC) memory technique includes various techniques for three-dimensionally arranging memory cells to achieve an increase in memory capacity. The memory capacity may be increased by a fine pattern technique and a multi-level cell (MLC) technique as well as the 3D-IC memory technique. However, the fine pattern technique may be expensive and the MLC technique may be limited to the number of bits per cell. Thus, the 3D-IC memory technique may be an important technique for increasing memory capacity. If the fine pattern technique and the MLC technique are combined with the 3D-IC memory technique, the memory capacity may be further increased. Thus, the fine pattern technique and the MLC technique may also be developed independently of the 3D-IC technique.

SUMMARY

Embodiments of the inventive concepts may provide semiconductor devices capable of improving a cell current.

Embodiments of the inventive concepts may also provide methods of fabricating a semiconductor device capable of improving a cell current.

In some embodiments, a semiconductor device may include a stack structure disposed on a substrate, an active pillar penetrating the stack structure, and a crystallization inducing metal doped in the active pillar. A doping concentration of the crystallization inducing metal in the active pillar may be varied depending on a height from a bottom surface of the active pillar.

In some embodiments, the active pillar may include an active plug adjacent the substrate and an active shell having a hollow cup-shape on the active plug. A doping concentration of the crystallization inducing metal at a bottom surface of the active shell may be higher than a doping concentration of the crystallization inducing metal at a sidewall of the active shell.

In some embodiments, the active pillar may further include a first active pad on a top end of the active shell and having a disk-shaped plane.

In some embodiments, a doping concentration of the crystallization inducing metal at a top surface of the first active pad may be higher than the doping concentration of the crystallization inducing metal at the sidewall of the active shell.

In some embodiments, the active pillar may further include at least one second active pad between the first active pad and the active plug.

In some embodiments, a doping concentration of the crystallization inducing metal at an interface between the active shell and the second active pad may be higher than the doping concentration of the crystallization inducing metal at the sidewall of the active shell.

In some embodiments, the stack structure may include a plurality of sub-stack structures, and each of the sub-stack structures may include conductive layers and insulating layers that are alternately stacked. The active pillar may penetrate the sub-stack structures, and a sidewall of the active pillar adjacent an interface between the sub-stack structures may be bent or otherwise non-linear.

In some embodiments, the active pillar may include polysilicon having a grain size of about 1 μm or more.

In some embodiments, methods of fabricating a semiconductor device may include forming sub-stack structures sequentially stacked on a substrate, forming an active pillar sequentially penetrating the sub-stack structures, the active pillar contacting the substrate, and increasing a grain size of the active pillar by a metal induced lateral crystallization method.

In some embodiments, increasing the grain size of the active pillar may include forming a metal silicide layer including a crystallization inducing metal on a top surface of the active pillar and performing an annealing process to diffuse the crystallization inducing metal into the active pillar.

In some embodiments, forming the active pillar may include forming sacrificial plugs respectively penetrating the sub-stack structures, the sacrificial plugs vertically overlapping with each other, removing all of the sacrificial plugs; and forming the active pillar in empty regions formed by the removal of the sacrificial plugs.

In some embodiments, each of the sub-stack structures may include sacrificial layers and insulating layers that are alternately stacked. In this case, the methods may further include forming sacrificial lines spaced apart from the sacrificial plugs, the sacrificial lines respectively penetrating the sub-stack structures, and the sacrificial lines vertically overlapping with each other. Methods may also include removing the sacrificial lines to form a groove, removing the sacrificial layers through the groove, filling spaces formed by the removal of the sacrificial layers with a conductive layer, and forming a buried insulation layer in the groove.

In some embodiments, forming the active pillars may include forming sub-active pillars respectively penetrating the sub-stack structures. The sub-active pillars may constitute the active pillar.

In some embodiments, increasing the grain size of the active pillar may include forming a metal silicide layer including the crystallization inducing metal on a top surface of each of the sub-active pillars and performing an annealing process to diffuse the crystallization inducing metal into each of the sub-active pillars.

In some embodiments, each of the sub-stack structures may include sacrificial layers and insulating layers that are alternately stacked. Methods may further include removing portions of the sub-stack structures spaced apart from the active pillar to form a groove, removing the sacrificial layers through the groove, filling spaces formed by the removal of the sacrificial layers with a conductive layer, and forming a buried insulation layer in the groove.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE DRAWINGS

The accompanying figures are included to provide a further understanding of the present inventive concept, and are incorporated in and constitute a part of this specification. The drawings illustrate some embodiments of the present inventive concept and, together with the description, serve to explain principles of the present inventive concept.

DETAILED DESCRIPTION

Figure 1:
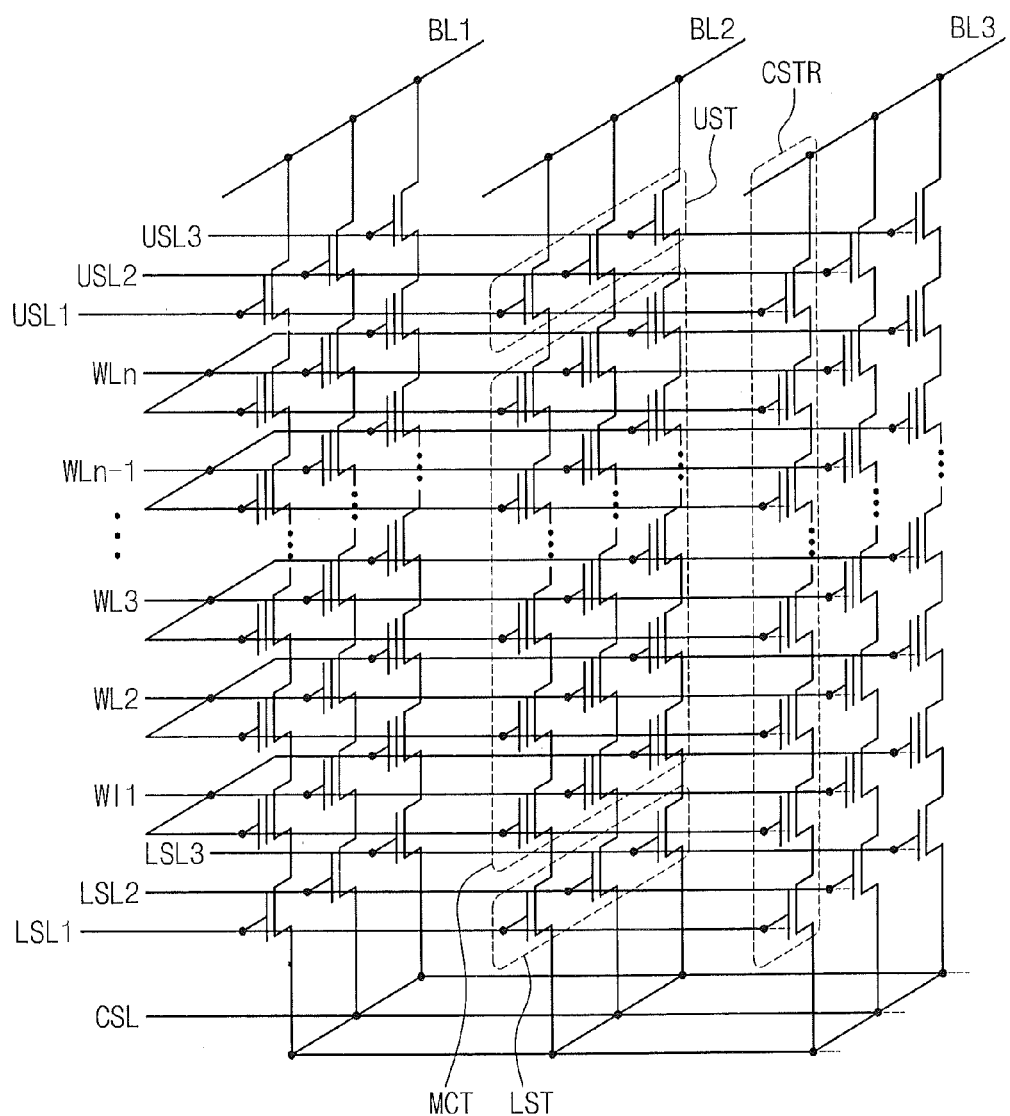
FIG. 1 is a circuit diagram illustrating a semiconductor device according to some embodiments of the inventive concepts.

The inventive concepts will now be described more fully hereinafter with reference to the accompanying drawings, in which example embodiments of the inventive concepts are shown. The advantages and features of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. Accordingly, the example embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, embodiments in the detailed description will be described with sectional views as ideal example views of the inventive concepts. Accordingly, shapes of the example views may be modified according to manufacturing techniques and/or allowable errors. Therefore, the embodiments of the inventive concepts are not limited to the specific shape illustrated in the example views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Example embodiments of aspects of the present inventive concepts explained and illustrated herein include their complementary counterparts. The same reference numerals or the same reference designators denote the same elements throughout the specification.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Hereinafter, some embodiments of the inventive concepts will be described with reference to the drawings in detail. Non-volatile memory devices according to embodiments of the inventive concepts have a structure of a three-dimensional (3D) semiconductor device.

Figure 2:
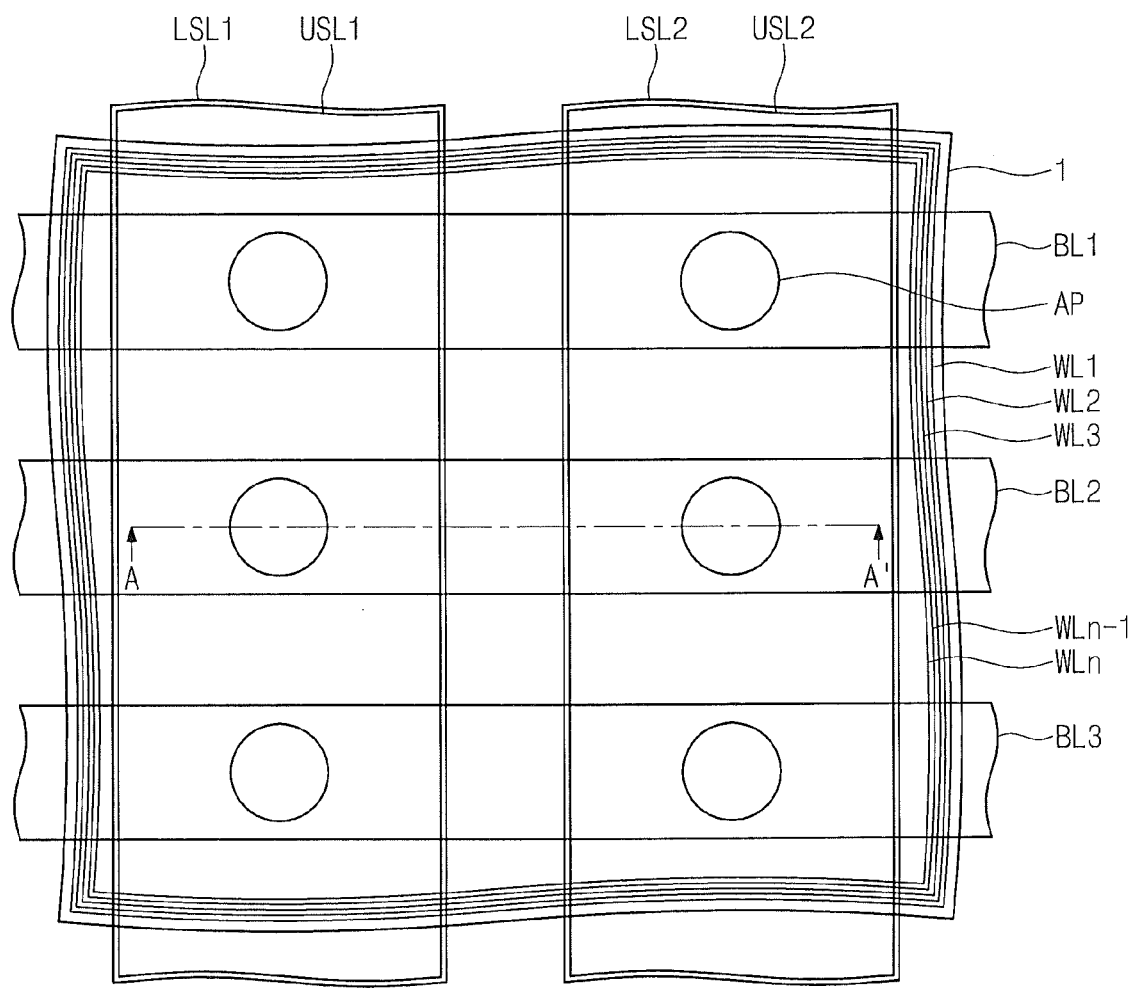
FIG. 2 is a plan view illustrating a semiconductor device according to some embodiments of the inventive concepts.
Figure 3:
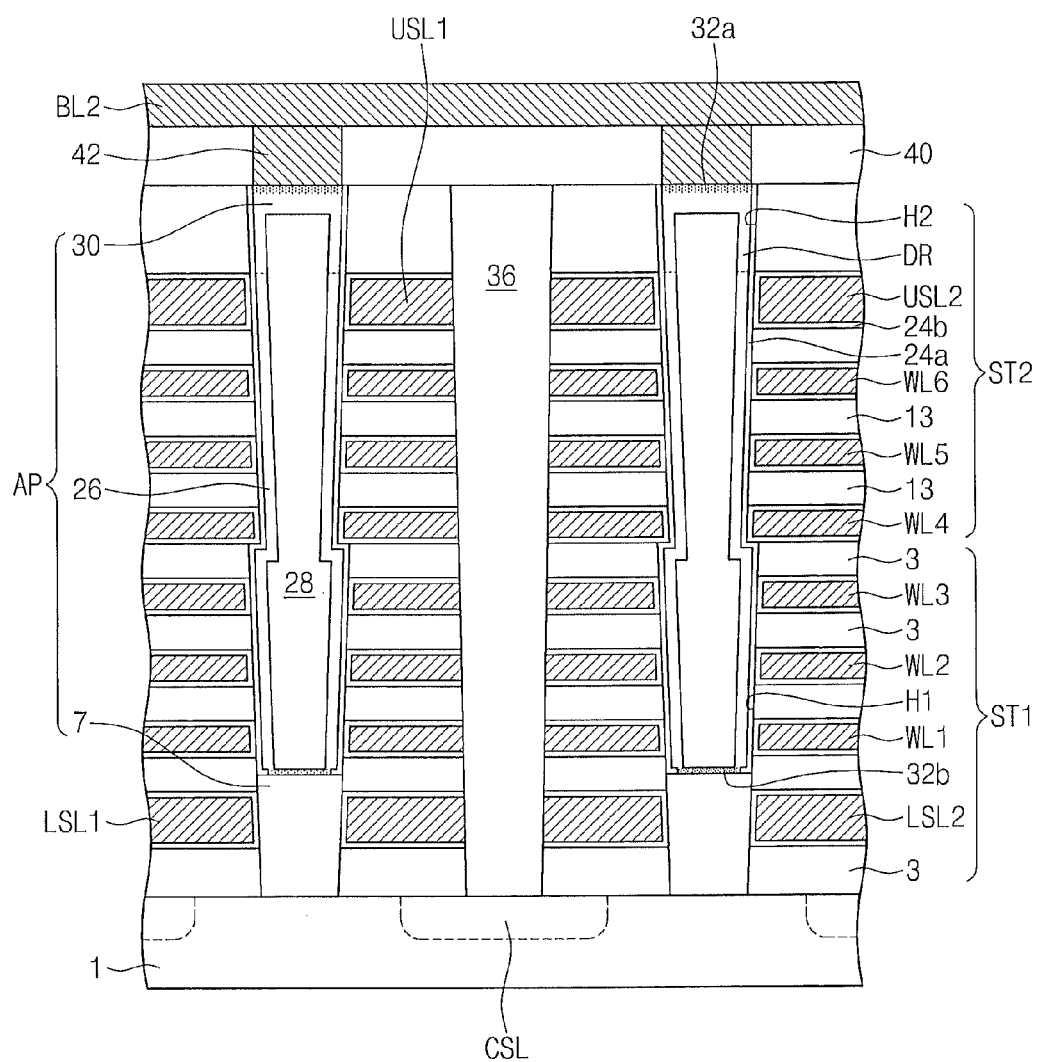
FIG. 3 is a cross-sectional view taken along a line A-A' of FIG. 2 to illustrate a semiconductor device according to some embodiments of the inventive concepts.

FIG. 1 is a circuit diagram illustrating a semiconductor device according to example embodiments of the inventive concepts. FIG. 2 is a plan view illustrating a semiconductor device according to example embodiments of the inventive concepts. FIG. 3 is a cross-sectional view taken along a line A-A' of FIG. 2 to illustrate a semiconductor device according to some embodiments of the inventive concepts.

Referring to FIGS. 1 to 3, a vertical semiconductor device according to some embodiments includes a first sub-stack structure ST1 and a second sub-stack structure ST2 that are sequentially stacked on a substrate 1. Each of the first and second sub-stack structures ST1 and ST2 includes conductive lines LSL, WL and/or USL and intergate insulating layers 3 or 13 that are alternately stacked. The intergate insulating layers 3 and 13 include first intergate insulating layers 3 and second intergate insulating layers 13. The conductive lines LSL, WL and USL include a lower selection line LSL, a plurality of word lines WL1 to WLn and a plurality of upper selection lines USL1 to USL3.

An active pillar AP penetrates the second sub-stack structure ST2 and the first sub-stack structure ST1. The active pillar AP is disposed in a first active hole H1 and in a second active hole H2. The first active hole H1 is formed in the first sub-stack structure ST1, and the second active hole H2 is formed in the second sub-stack structure ST2. The first and second active holes H1 and H2 vertically overlap with each other. Sidewalls of the first and second holes H1 and H2 may be inclined. Heights of the first and second sub-stack structures ST1 and ST2 may correspond to heights capable of neglecting cell dispersion caused by the inclined sidewalls of the active holes H1 and H2.

The active pillar AP may include an active plug 7, an active shell 26, and an active pad 30. The active plug 7 is disposed on a bottom of the first active hole H1 and is in contact with the substrate 1. The active shell 26 continuously covers the sidewalls of the first and second active holes H1 and H2 and has a hollow cup-shape. The active pad 30 is disposed on a top end of the active shell 26 and has a disk-shaped plane. The inside of the active shell 26 is filled with a buried insulation layer 28. A sidewall of the active shell 26 may be bent or otherwise non-linear in a boundary region between the first sub-stack structure ST1 and the second sub-stack structure ST2. The active pillar AP may be doped with a crystallization inducing metal. For example, the crystallization inducing metal may include nickel (Ni), palladium (Pd), germanium (Ge), and/or aluminum (Al), A concentration of the crystallization inducing metal in the active pillar AP may be in the range of about $1 \times 10^{17}$ atoms/cm$^3$ to about $1 \times 10^{18}$ atoms/cm$^3$. The concentration of the crystallization inducing metal in the active pillar AP may be varied depending on its position. In other words, the active pillar AP may include high-concentration regions 32a and 32b having a crystallization inducing metal concentration higher than that of another portion (e.g., the sidewall of the active shell 26 or the inside of the active plug 7) of the active pillar AP. A first high-concentration region 32a may be disposed to be adjacent a top surface of the active pad 30, and a second high-concentration region 32b may be disposed to be adjacent a bottom surface of the active shell 26.

A first gate insulating layer 24a may be disposed between the active pillar AP and the conductive lines LSL, WL and USL and between the active pillar AP and the intergate insulating layers 3 and 13. A second gate insulating layer 24b may be disposed between the first gate insulating layer 24a and the conductive lines LSL, WL and USL. The second gate insulating layer 24b may extend to be disposed between the conductive lines LSL, WL and USL and the intergate insulating layers 3 and 13. For example, the first gate insulating layer 24a and the second gate insulating layer 24b may include at least one of a tunnel insulating layer, a data storage layer and a blocking insulating layer.

A filling insulation line 36 spaced apart from the active pillar AP penetrates the sub-stack structures ST1 and ST2. The conductive lines disposed at the same level from the substrate 1 may be separated from each other by the filling insulation line 36.

A common source line CSL doped with dopants may be disposed in the substrate under the filling insulation line 36. A common drain region DR may be disposed in a top end portion of the active pillar AP. The second sub-stack structure ST2 is covered by an upper insulating layer 40. A plurality of bit lines BL1 to BL3 are disposed on the upper insulating layer 40. The bit lines BL1 and BL3 are parallel to each other. The bit lines BL1 to BL3 may be in contact with bit line contact plugs 42 penetrating the upper insulating layer 40. The bit line contact plugs 42 may be in contact with the common drain regions DR, respectively.

The conductive lines LSL, WL and USL, the gate insulating layers 24a and 24b adjacent thereto, and the active pillar AP adjacent thereto may constitute transistors LST, MCT and UST. In other words, the lower selection line LSL, the gate insulating layers 24a and 24b adjacent thereto and the active pillar AP adjacent thereto may constitute a lower selection transistor LST. The upper selection line USL, the gate insulating layers 24a and 24b adjacent thereto and the active pillar AP adjacent thereto may constitute an upper selection transistor UST. The word line WL, the gate insulating layers 24a and 24b adjacent thereto and the active pillar AP adjacent thereto may constitute a memory cell transistor MCT. The upper and lower selection transistors UST and LST and a plurality of memory cell transistors MCT that are adjacent one active pillar AP may constitute one cell string CSTR. The plurality of memory cell transistors are disposed between the upper and lower selection transistors UST and LST in the one cell string CSTR. A plurality of cell strings CSTR may be disposed between the common source line CSL and a plurality of bit lines BL1, BL2 and BL3.

The lower and upper selection transistors LST and UST and the memory cell transistors MCT may be metal-oxide-semiconductor field effect transistors (MOSFETs) using the active pillar AP as channel regions.

Next, methods of fabricating the semiconductor device will be described.

FIGS. 4 to 12 are cross-sectional views illustrating methods of fabricating a semiconductor device having the cross-sectional view of FIG. 3.

Figure 4:
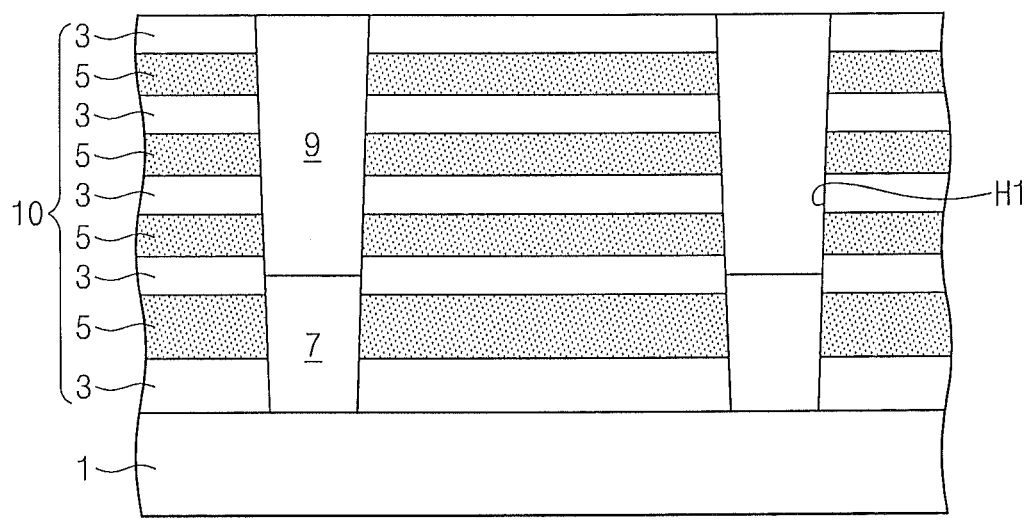
FIGS. 4 to 12 are cross-sectional views illustrating methods of fabricating a semiconductor device having the cross-sectional view of FIG. 3.

Referring to FIG. 4, first sacrificial layers 5 and first intergate insulating layers 3 are alternately stacked on a substrate 1, thereby forming a first preliminary stack structure 10. The first sacrificial layers 5 are formed of a material having an etch rate different from an etch rate of the first intergate insulating layers 3. For example, the first sacrificial layers 5 may be formed of silicon nitride layers, and the first intergate insulating layers 3 may be formed of silicon oxide layers. The first preliminary stack structure 10 is patterned to form a first active hole H1 exposing the substrate 1. Next, an active plug 7 is formed in the first active hole H1 by a selective epitaxial growth (SEG) process. The active plug 7 partially fills the first active hole H1. Subsequently, the first active hole H1 is filled with a sacrificial plug 9. For example, the sacrificial plug 9 may include a hydrocarbon-based material.

Figure 5:
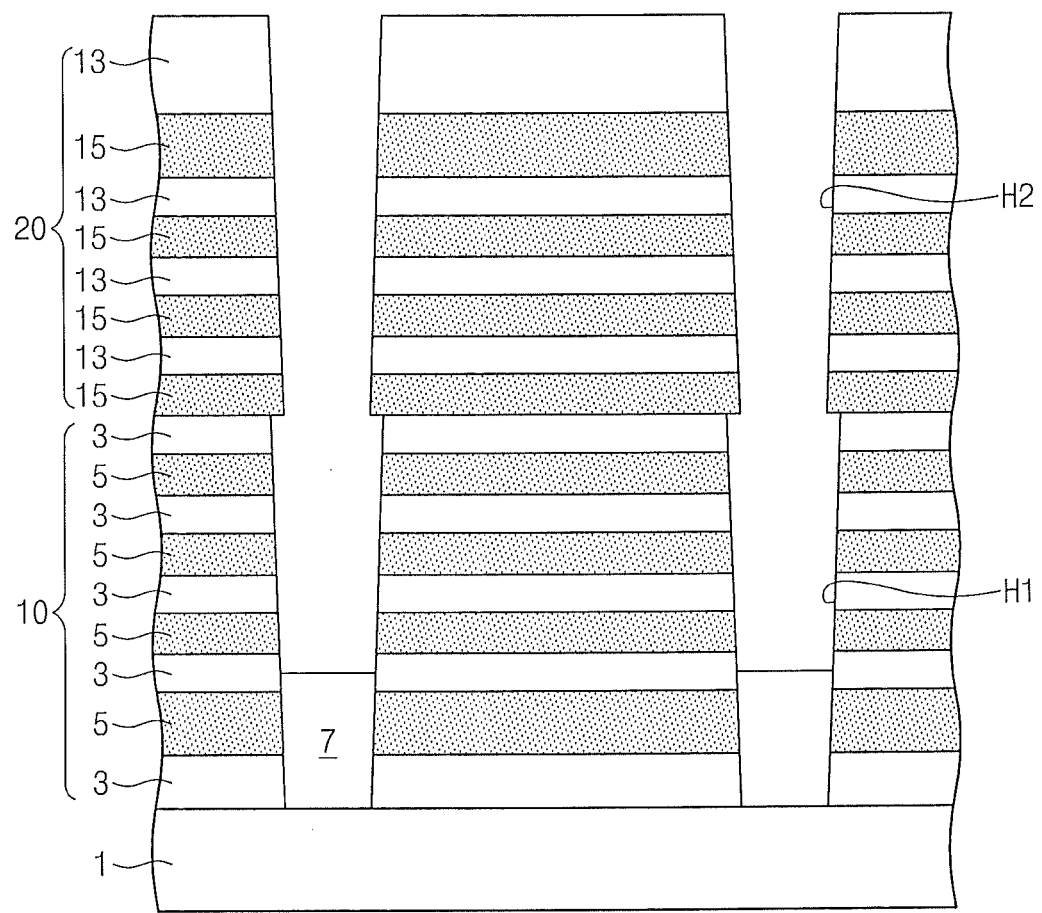

Referring to FIG. 5, second sacrificial layers 15 and second intergate insulating layers 13 are alternately stacked on the first preliminary stack structure 10, thereby forming a second preliminary stack structure 20. The second preliminary stack structure 20 is patterned to form a second active hole H2 exposing the sacrificial plug 9. The sacrificial plug 9 exposed through the second active hole H2 is selectively removed to expose the active plug 7.

Figure 6:
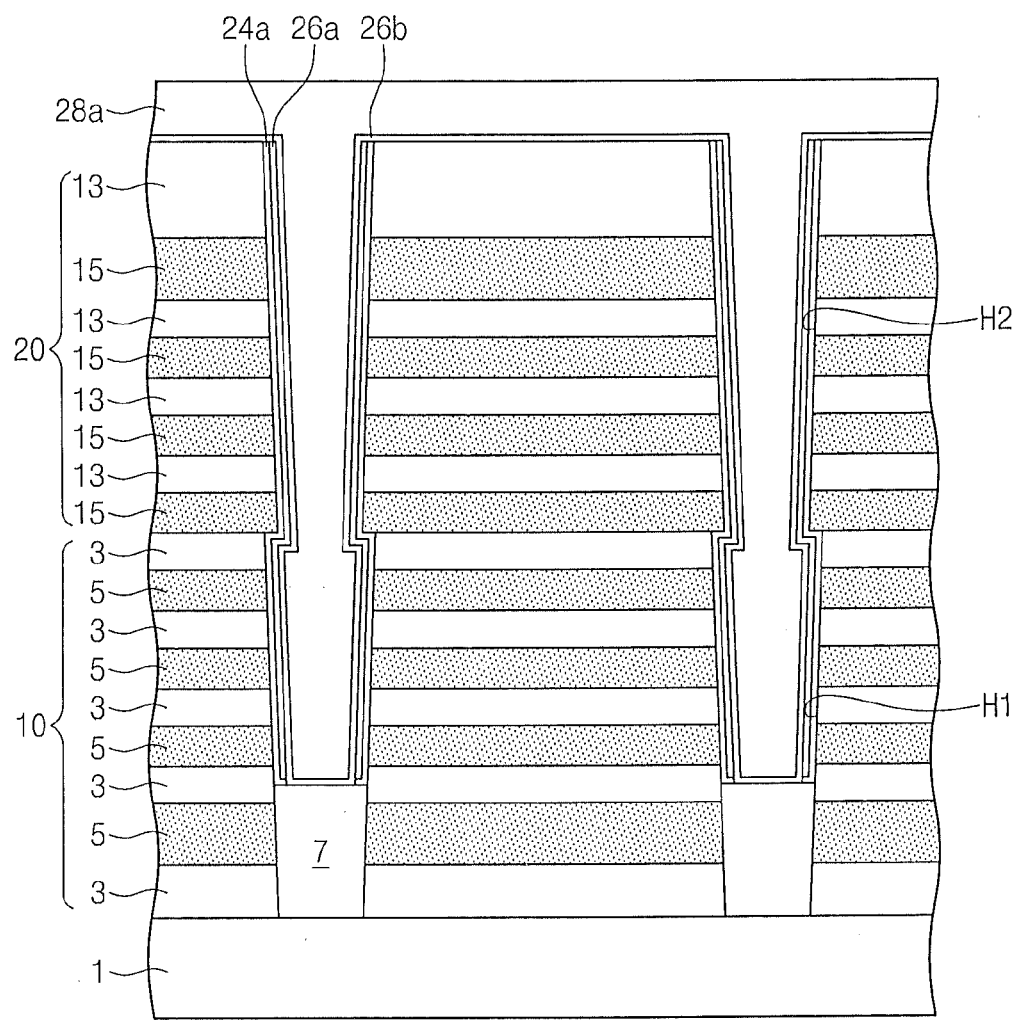

Referring to FIG. 6, a first gate insulating layer 24a and a first active layer 26a are sequentially formed on an entire surface of the substrate 1. The gate insulating layer 24a and the first active layer 26a conformally cover inner surfaces of the first and second active holes H1 and H2. An anisotropic etching process is performed on the first active layer 26a and the first gate insulating layer 24a to expose a top surface of an uppermost second intergate insulating layer 13 and a top surface of the active plug 7. At this time, the first gate insulating layer 24a and the first active layer 26a having spacer-shapes are formed on sidewalls of the first and second active holes H1 and H2. The first active layer 26a may protect the first gate insulating layer 24a during the anisotropic etching process. A second active layer 26b is conformally formed on the entire surface of the substrate 1. The second active layer 26b may be formed of the same poly-silicon layer as the first active layer 26a. Next, a first buried insulation layer 28a is formed to fill the first and second active holes H1 and H2. The first buried insulation layer 28a may be formed of a silicon oxide layer.

Figure 7:
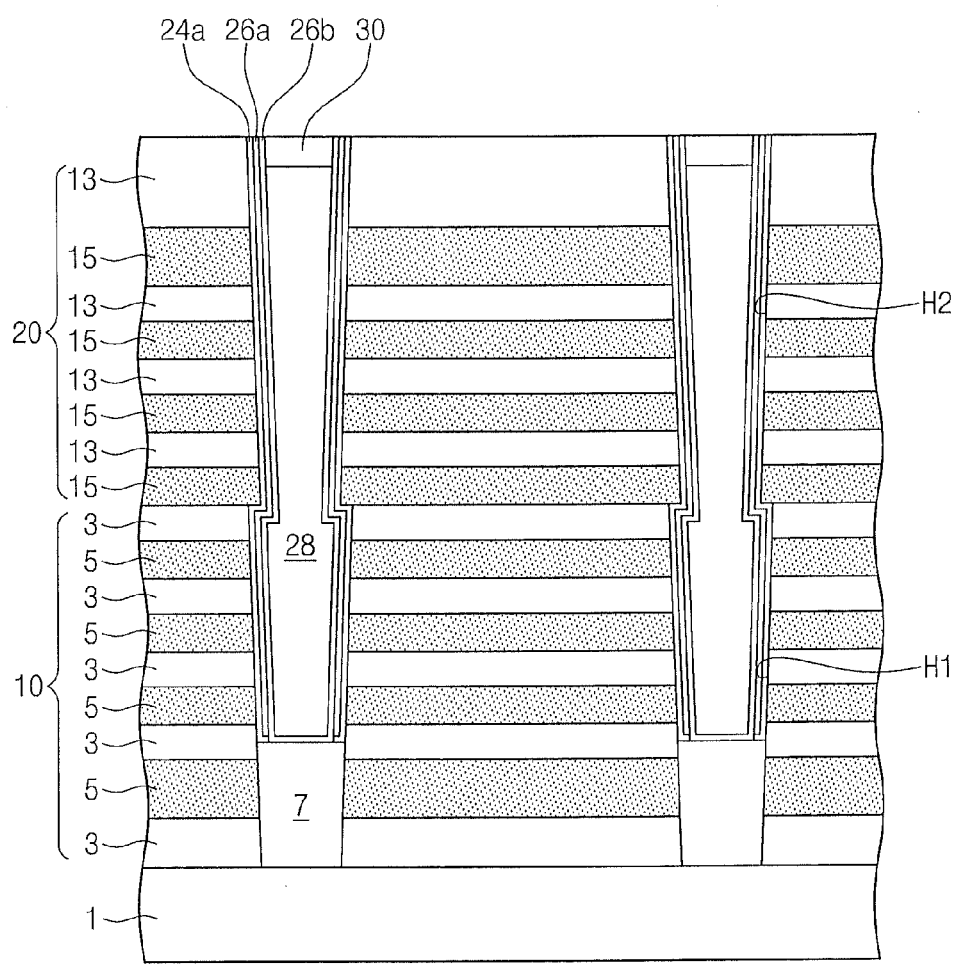

Referring to FIG. 7, a blanket etch-back process is performed on the first buried insulation layer 28a to form a first filling insulation pattern 28 having a top surface lower than a top end of the second active hole H2. The first buried insulation layer 28 on the top surface of the uppermost second intergate insulating layer 13 is removed by the blanket etch-back process. Subsequently, a third active layer is formed to fill an upper region of the second active hole H2. The third active layer may be formed of the same material as the second active layer 26b. A planarization etching process is performed to remove the second active layer 26b and the third active layer on the top surface of the uppermost second intergate insulating layer 13. Thus, an active pad 30 is formed in the upper region of the second active hole H2.

Figure 8:
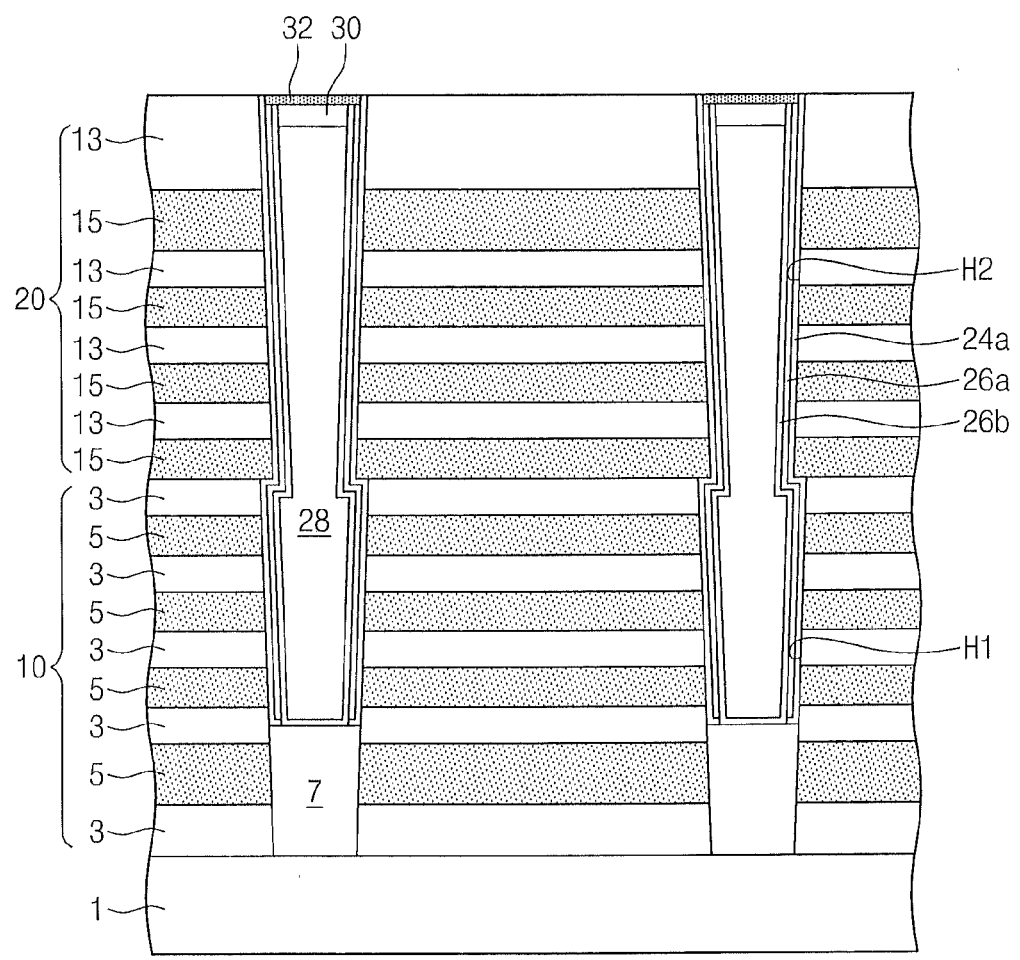

Referring to FIG. 8, a crystallization inducing metal layer is deposited on the entire surface of the substrate 1 and then a silicidation process is performed to form a silicide layer 32 including a crystallization inducing metal on the active pad 30 and the second active layer 26b. For example, the crystallization inducing metal may include nickel (Ni), palladium (Pd), germanium (Ge), or aluminum (Al). The metal silicide layer 32 is not formed on the uppermost second intergate insulating layer 13 and the first gate insulating layer 24a. A portion of the crystallization inducing metal layer that is not changed into the metal silicide layer 32 is removed. In some embodiments, the silicidation process may be performed at a temperature of about 300 degrees Celsius to about 500 degrees Celsius for a relatively short time of about 10 minutes to about 30 minutes.

Figure 9:
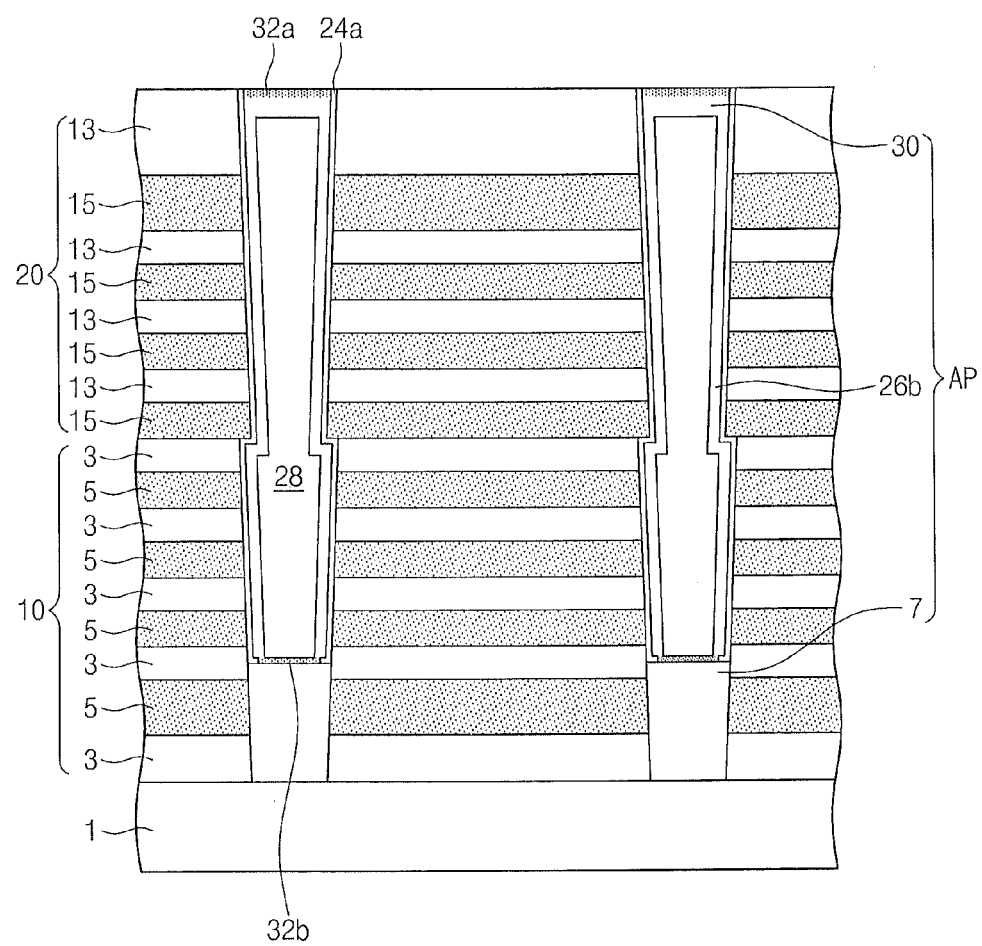

Referring to FIG. 9, an annealing process is performed to diffuse the crystallization inducing metal contained in the metal silicide layer 32 into the active pad 30 and the first and second active layers 26a and 26b, thereby performing a metal induced lateral crystallization process. The crystallization inducing metal may be diffused and may increase a grain size of poly-silicon composing the first and second active layers 26a and 26b. At this time, the increased grain size of the poly-silicon may be equal to or greater than about 1 μm. As a result, an active pillar AP doped with the crystallization inducing metal may be formed. The active pillar AP has the increased grain size of about 1 μm or more such that a cell current may be improved.

A concentration of the crystallization inducing metal in the active pillar AP may be in the range of about $1 \times 10^{17}$ atoms/$cm^3$ to about $1 \times 10^{18}$ atoms/$cm^3$. An interface between the active pad 30 and the first and second active layers 26a and 26b may mostly disappear by the crystallization. The first and second active layers 26a and 26b may become an active shell 26. Since the crystallization inducing metal is diffused into the active pillar AP, the concentration of the crystallization inducing metal may be non-uniform in the active pillar AP. High-concentration regions 32a and 32b may be formed in the active pillar AP. The high-concentration regions 32a and 32b may have a crystallization inducing metal concentration greater than that of another portion (e.g., a sidewall of the active shell 26 or the inside of the active plug 7) of the active pillar PL. A first high-concentration region 32a may be formed to be adjacent a position of an initial metal silicide layer 32 (i.e., the top surface of the active pad 30). A second high-concentration region 32b may be formed to be adjacent a bottom surface of the active shell 26. A portion of the crystallization inducing metal may not be diffused but may remain to form the first high-concentration region 32a. The diffused crystallization inducing metal may be blocked by the active plug 7 of a single crystalline state such that the second high-concentration region 32a may be formed to be adjacent the bottom surface of the active shell 26.

Figure 10:
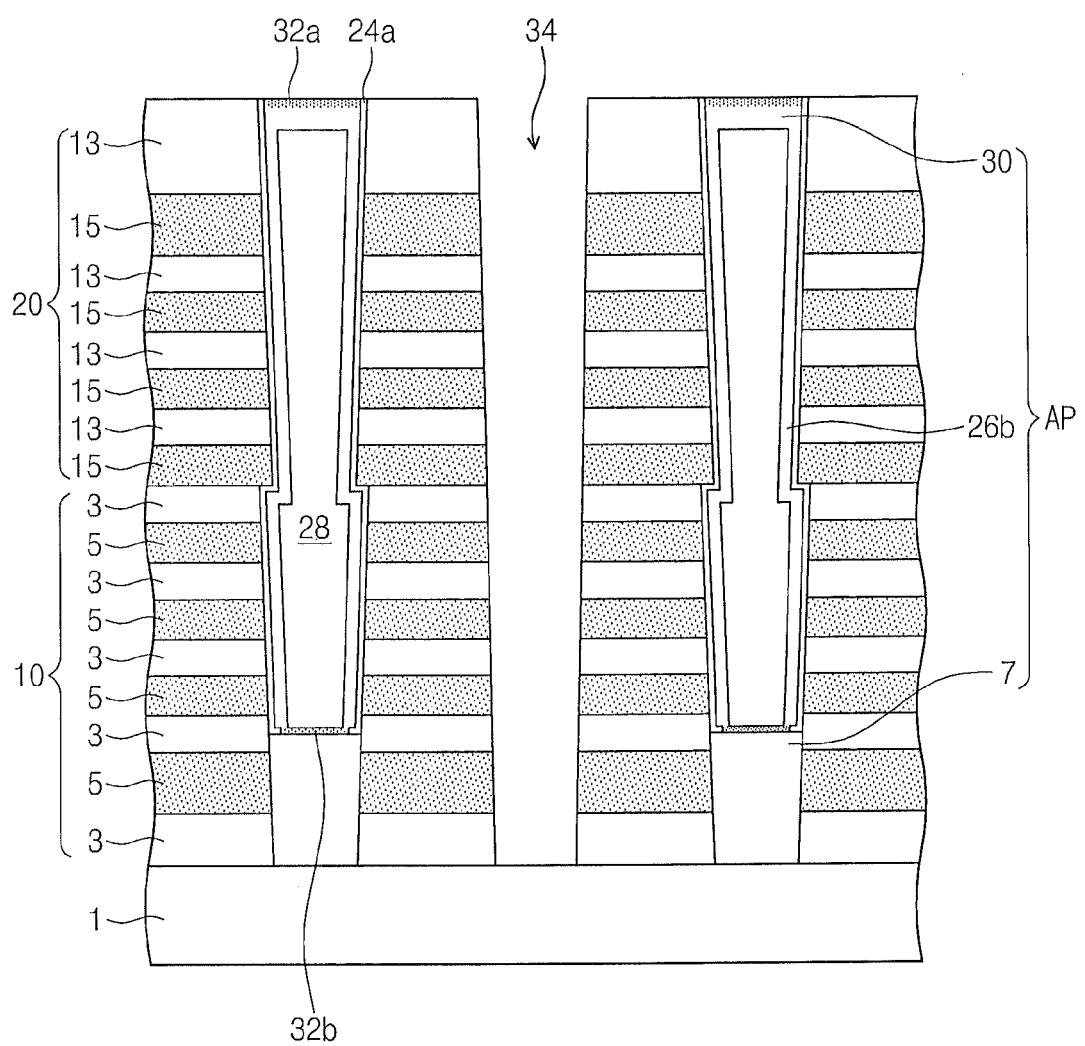

Referring to FIG. 10, the preliminary stack structures 20 and 10 spaced apart from the active pillar AP may be successively patterned to form a groove 34 having a linear shape extending in one direction. The groove 34 may expose the top surface of the substrate 1.

Figure 11:
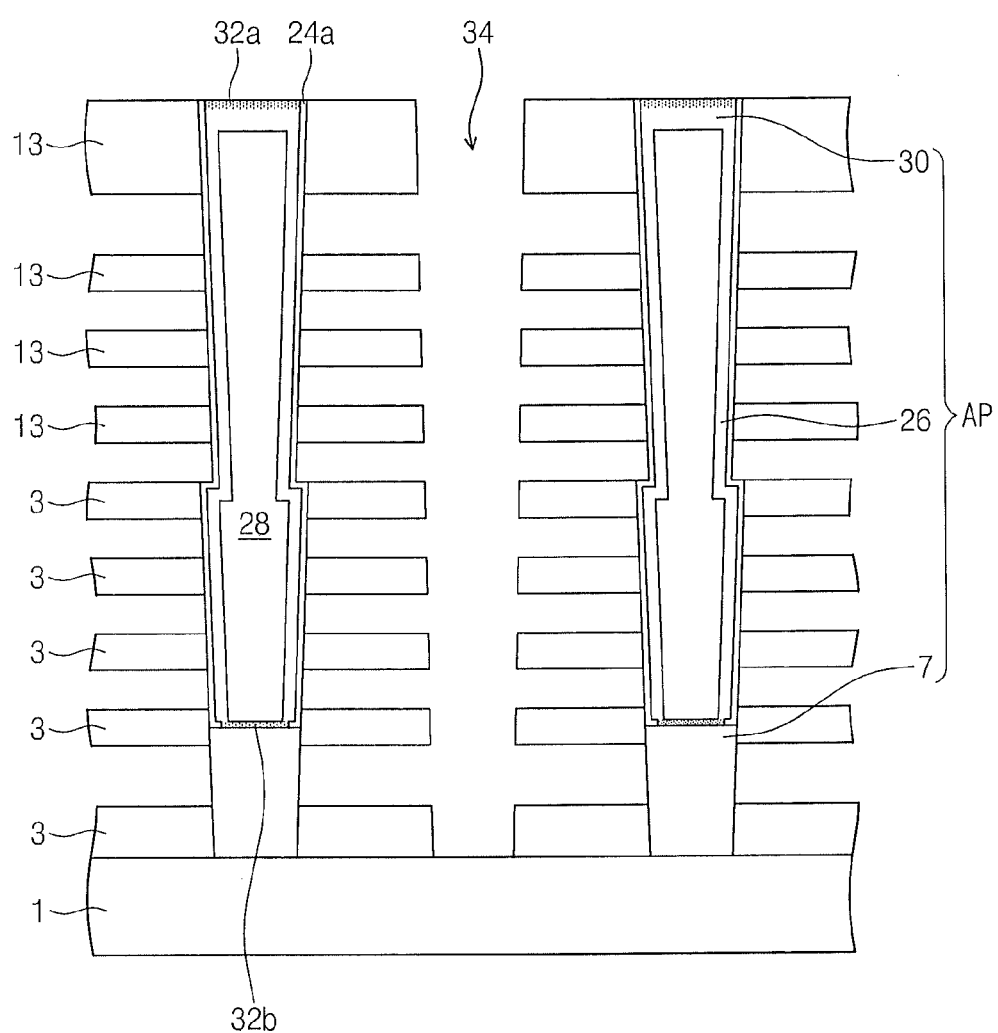

Referring to FIG. 11, an isotropic etching process is performed to remove the sacrificial layers 5 and 15 of the preliminary stack structures 20 and 10 through the groove 34. Thus, top and bottom surfaces of the intergate insulating layers 3 and 13 and a sidewall of the active pillar AP may be exposed.

Figure 12:
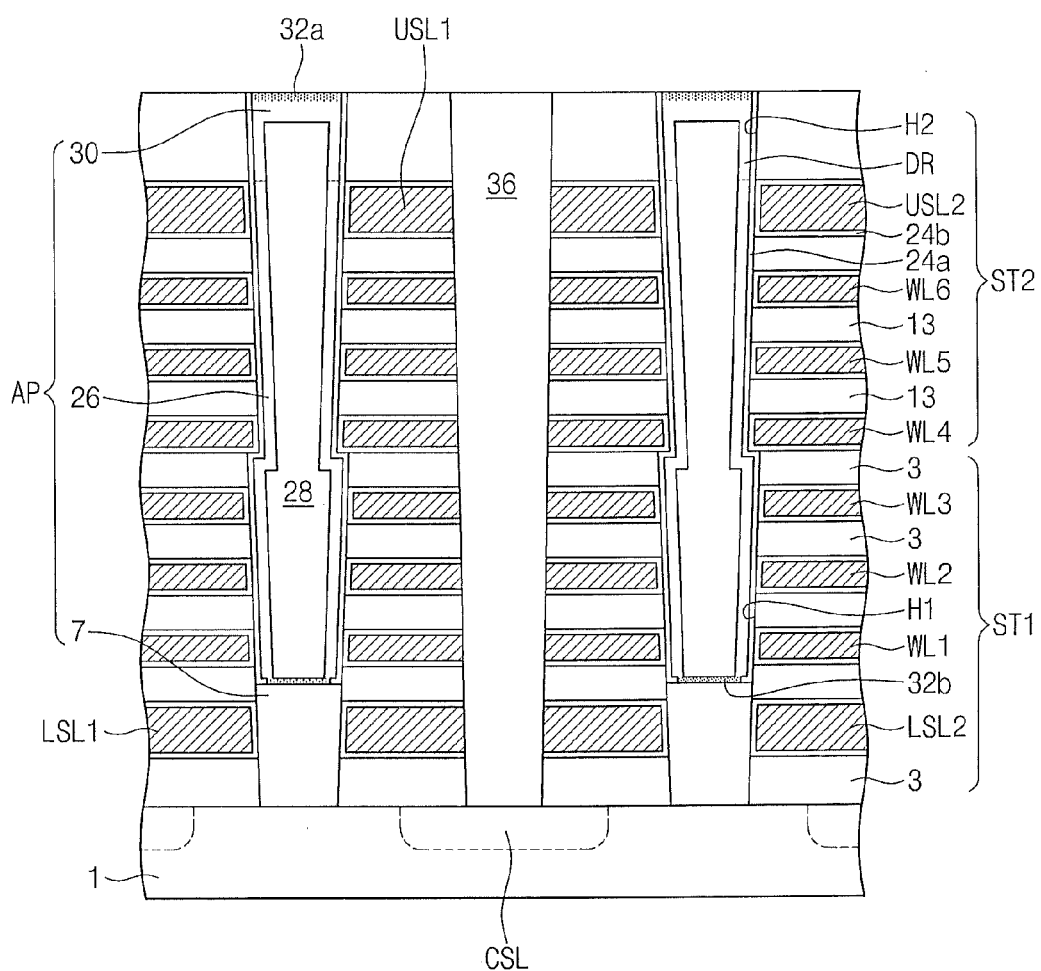

Referring to FIG. 12, an ion implantation process is performed to form a common source line CSL in the substrate 1 under a bottom of the groove 34. A second gate insulating layer 24b is conformally formed on the entire surface of the substrate 1. The second gate insulating layer 24b covers surfaces of the intergate insulating layers 3 and 13 and the sidewall of the active pillar AP. Next, a metal layer is formed to fill spaces between the intergate insulating layers 3 and 13 and the groove 34. The metal layer in the groove 34 is removed and then a second buried insulation layer 36 is formed to fill the groove 34. A planarization etching process is performed on the second buried insulation layer 36. Thus, the conductive lines LSL, WL and USL may be formed. An ion implantation process is performed to form a common drain region DR in a top end portion of the active pillar AP. Thus, sub-stack structures ST1 and ST2 may be formed.

Referring again to FIG. 3, an upper insulating layer 40 is formed on the second sub-stack structure ST2. The upper insulating layer 40 is patterned to form a contact hole exposing the active pillar AP and then the contact hole is filled with a conductive material, thereby forming a bit line contact plug 42. Next, bit lines BL1 to BL3 are formed on the upper insulating layer 40.

Figure 13:
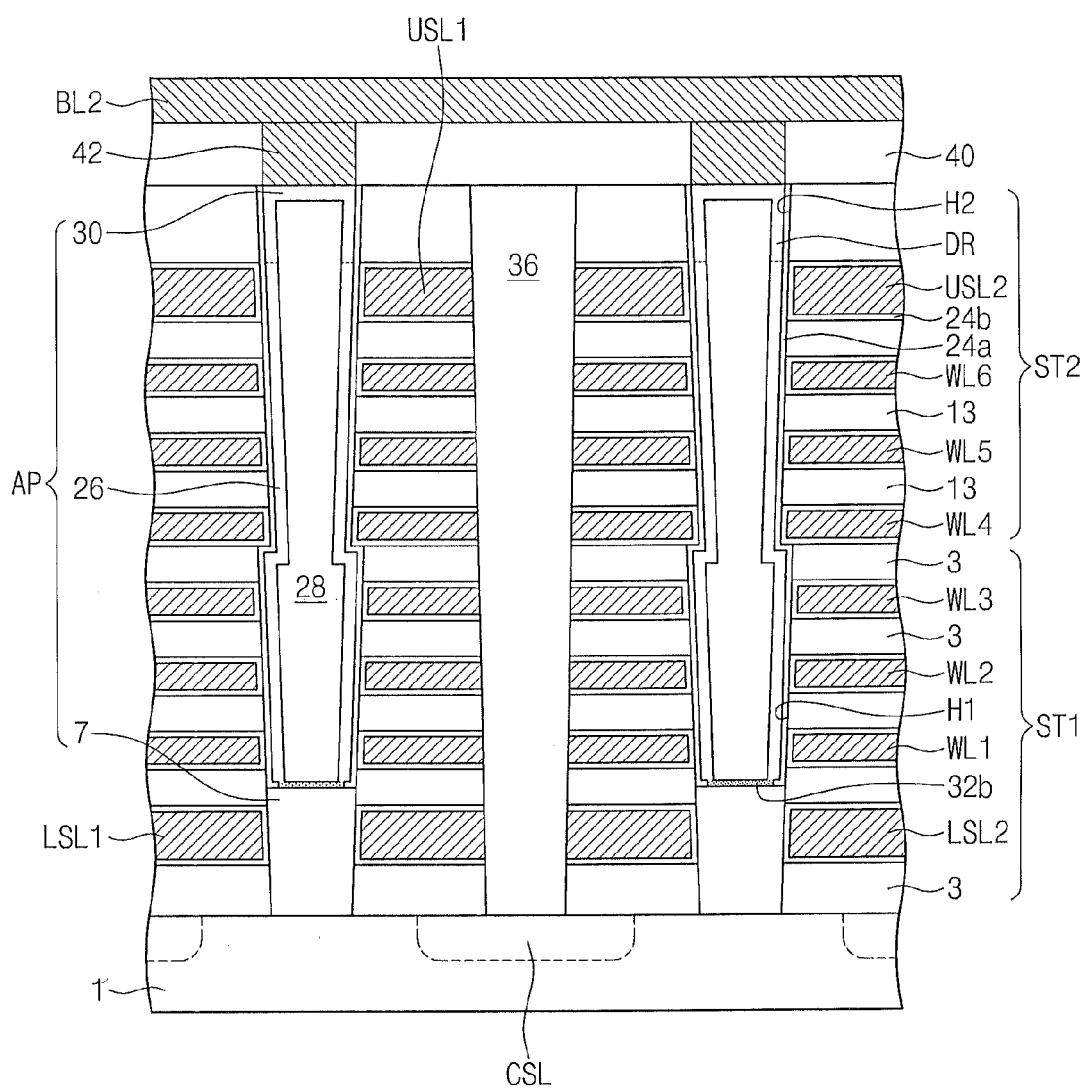
FIG. 13 is a cross-sectional view illustrating a semiconductor device according to some embodiments of the inventive concepts.

FIG. 13 is a cross-sectional view illustrating a semiconductor device according to some embodiments of the inventive concepts.

Referring to FIG. 13, the first high-concentration region 32a of the embodiments described with respect to FIG. 3 does not exist in the active pillar AP in a semiconductor device according to present embodiments. Thus, it is possible to prevent the crystalline inducing metal included in the first high-concentration region 32 from being diffused into peripheral layers. Other elements of the semiconductor device according to the present embodiment may be the same as or similar to corresponding elements of the semiconductor device of embodiments described with respect to FIG. 3 above.

Figure 14:
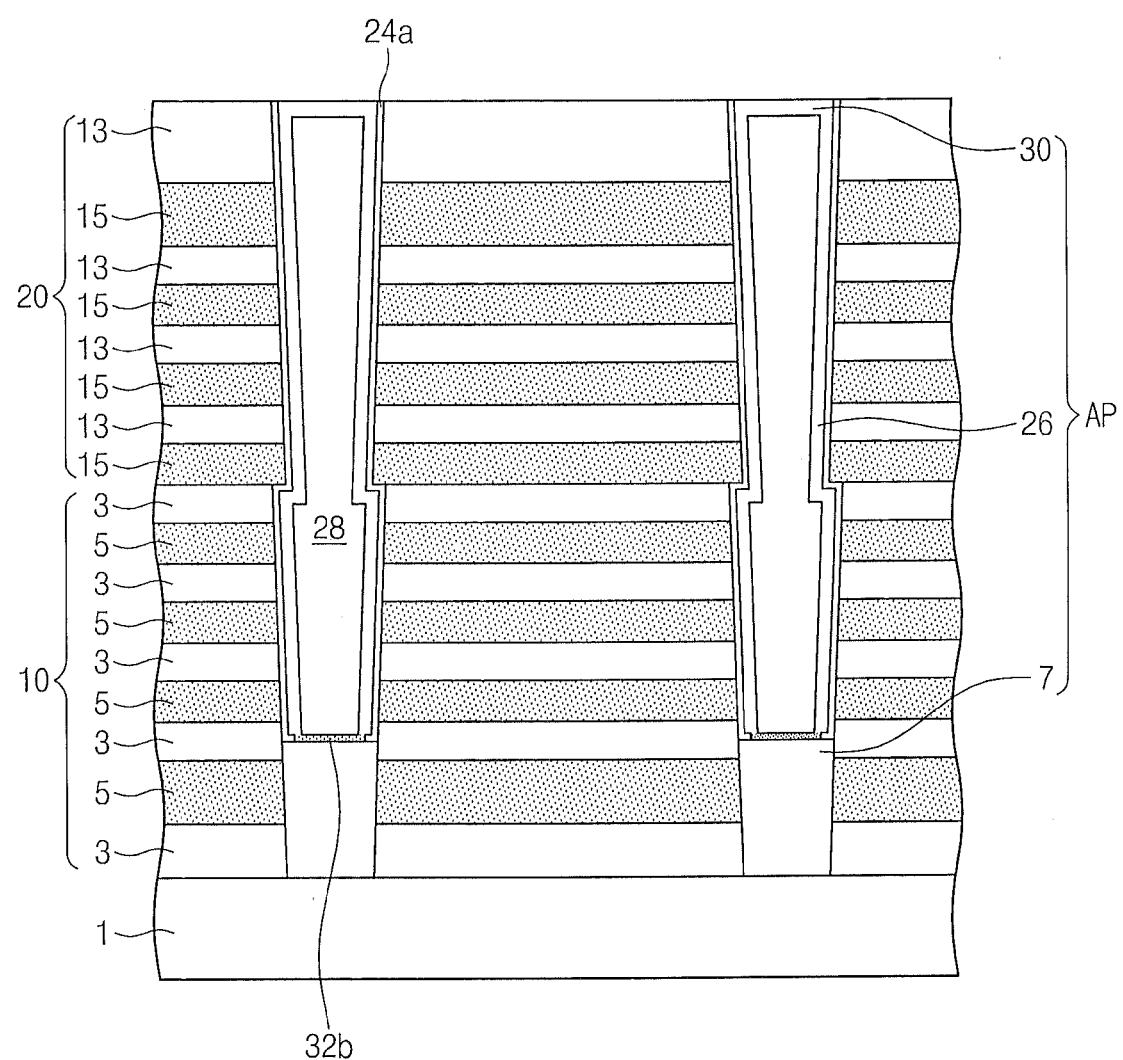
FIG. 14 is a cross-sectional view illustrating methods of fabricating the semiconductor device of FIG. 13.

FIG. 14 is a cross-sectional view illustrating methods of fabricating the semiconductor device of FIG. 13.

Referring to FIG. 14, a chemical mechanical polishing (CMP) process is performed on the structure of FIG. 9 to remove the first high-concentration region 32a. Thereafter, the same subsequent processes as described in the embodiments described with respect to FIG. 3 may be performed.

Figure 15:
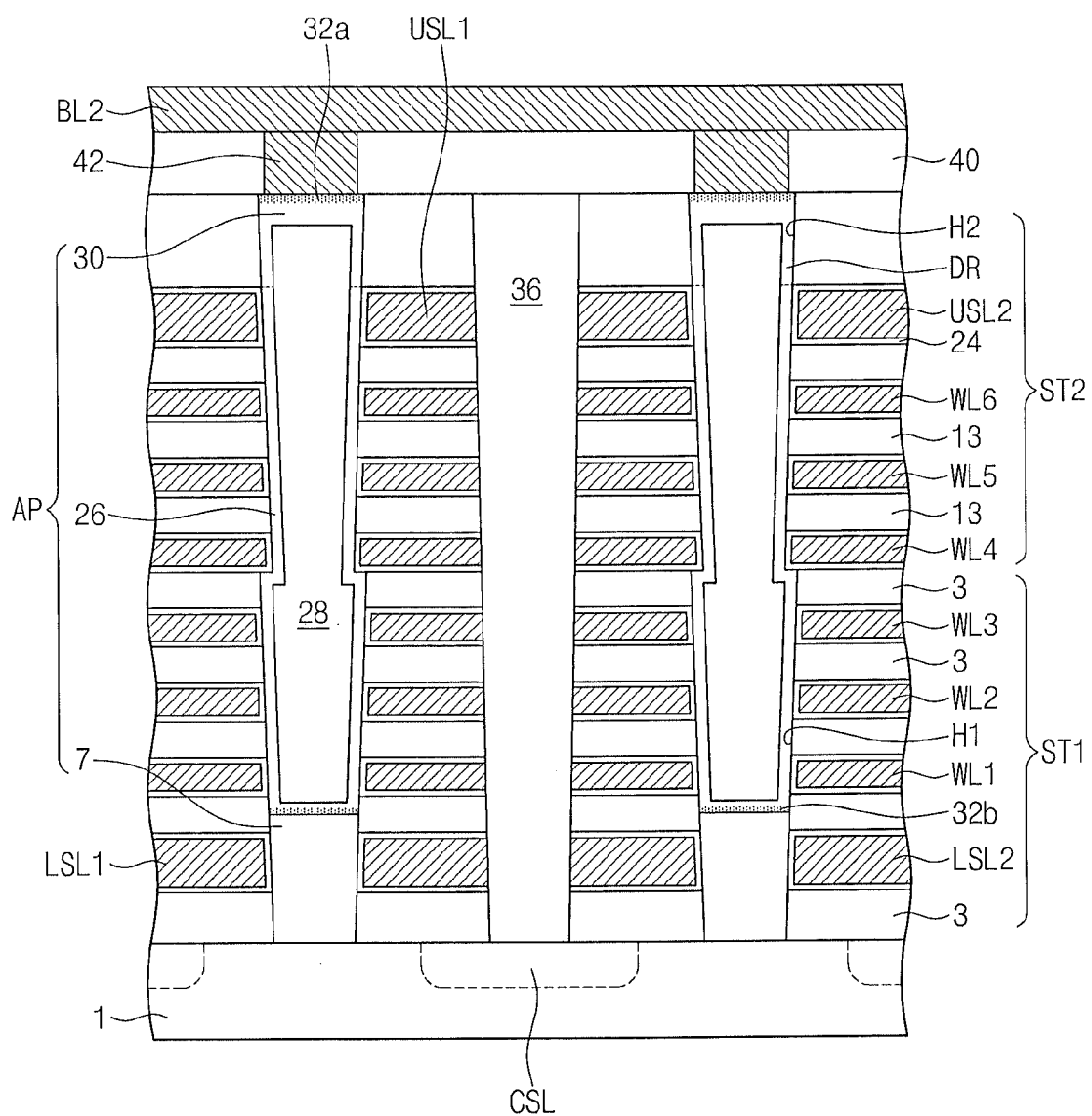
FIG. 15 is a cross-sectional view illustrating a semiconductor device according to some embodiments of the inventive concepts.

FIG. 15 is a cross-sectional view illustrating a semiconductor device according to some embodiments of the inventive concepts.

Referring to FIG. 15, the first gate insulating layer 24a of the embodiments described with respect to FIG. 3 does not exist in a semiconductor device according to the present embodiments. A gate insulating layer 24 is disposed between the active pillar AP and the conductive lines LSL, WL and USL and between the conductive lines LSL, WL and USL and the intergate insulating layers 3 and 13. Other elements of the semiconductor device according to the present embodiments may be the same as or similar to corresponding elements of the embodiments described with respect to FIG. 3.

Figure 16:
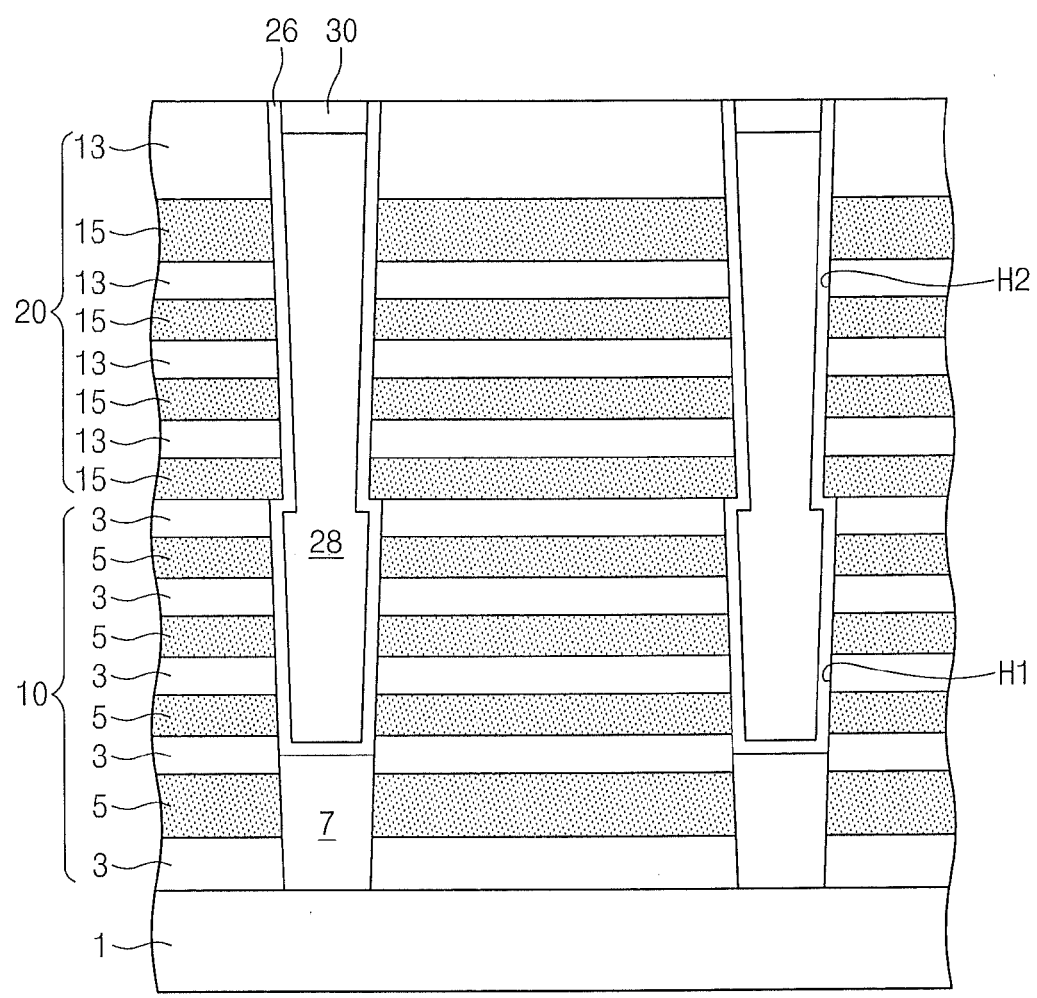
FIG. 16 is a cross-sectional view illustrating methods of fabricating the semiconductor device of FIG. 15.

FIG. 16 is a cross-sectional view illustrating methods of fabricating the semiconductor device of FIG. 15.

Referring to FIG. 16, an active layer 26 is formed to conformally cover the sidewalls of the first and second active holes H1 and H2 of the structure illustrated in FIG. 5. A first buried insulation layer is formed to fill the first and second active holes H1 and H2. A blanket etch-back process is performed on the first buried insulation layer to form a first filling insulation pattern 28 having a top surface lower than a top end of the second active hole H2. An active pad 30 is formed in the upper region of the second active hole H2. Thereafter, subsequent processes of the present embodiments may be the same as or similar to corresponding processes of the embodiments described with respect to FIG. 3.

Figure 17:
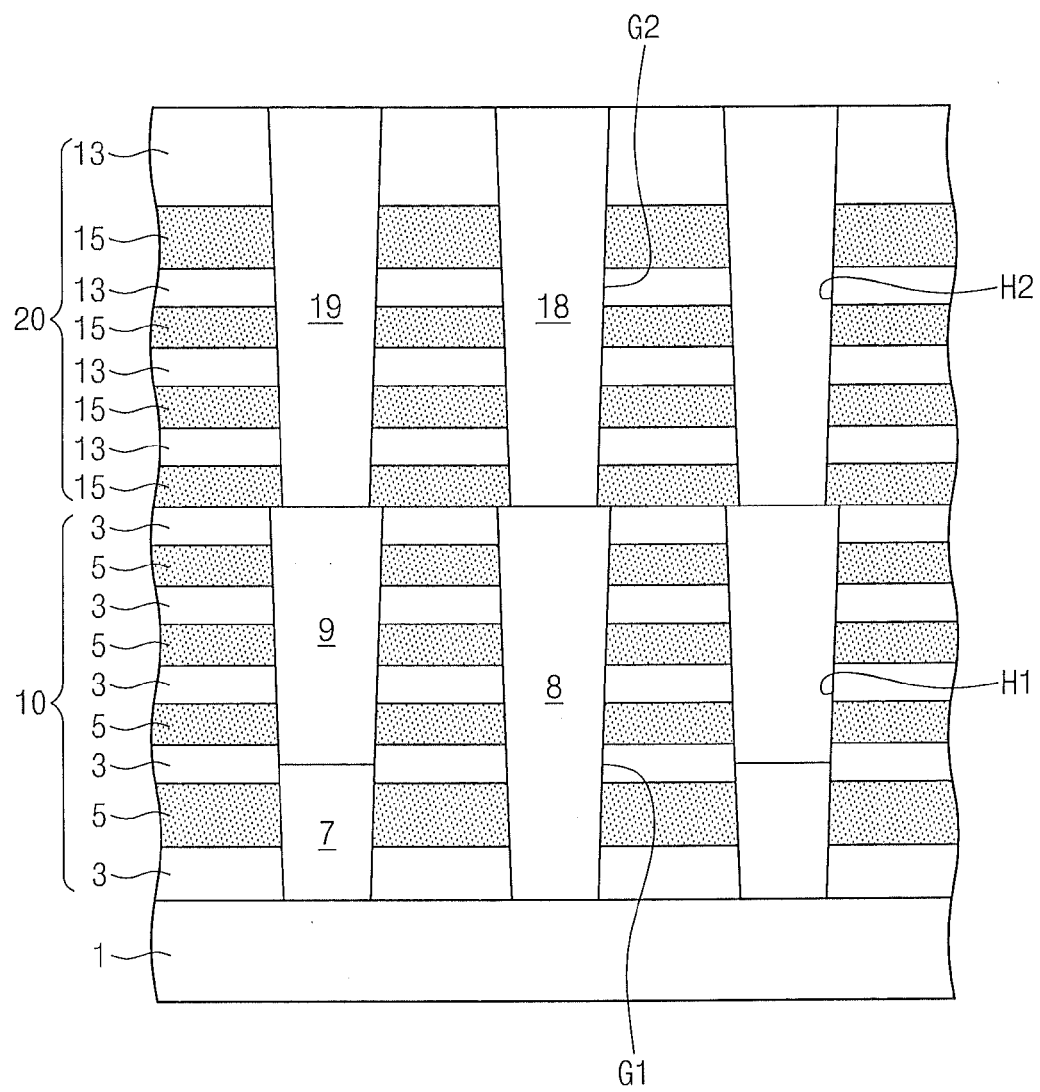
FIGS. 17 to 19 are cross-sectional views illustrating methods of fabricating the semiconductor device of FIG. 15 according to some embodiments of the inventive concepts.
Figure 18:
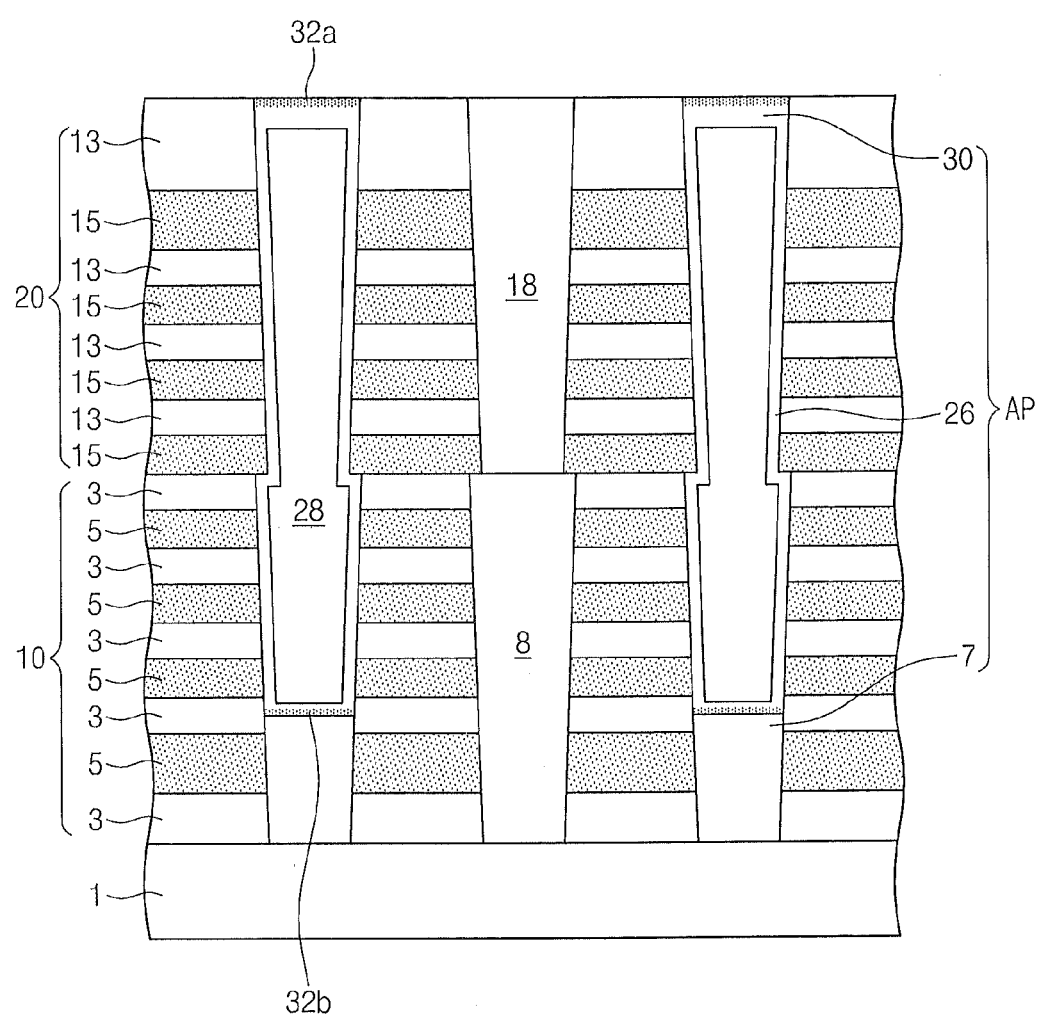
Figure 19:
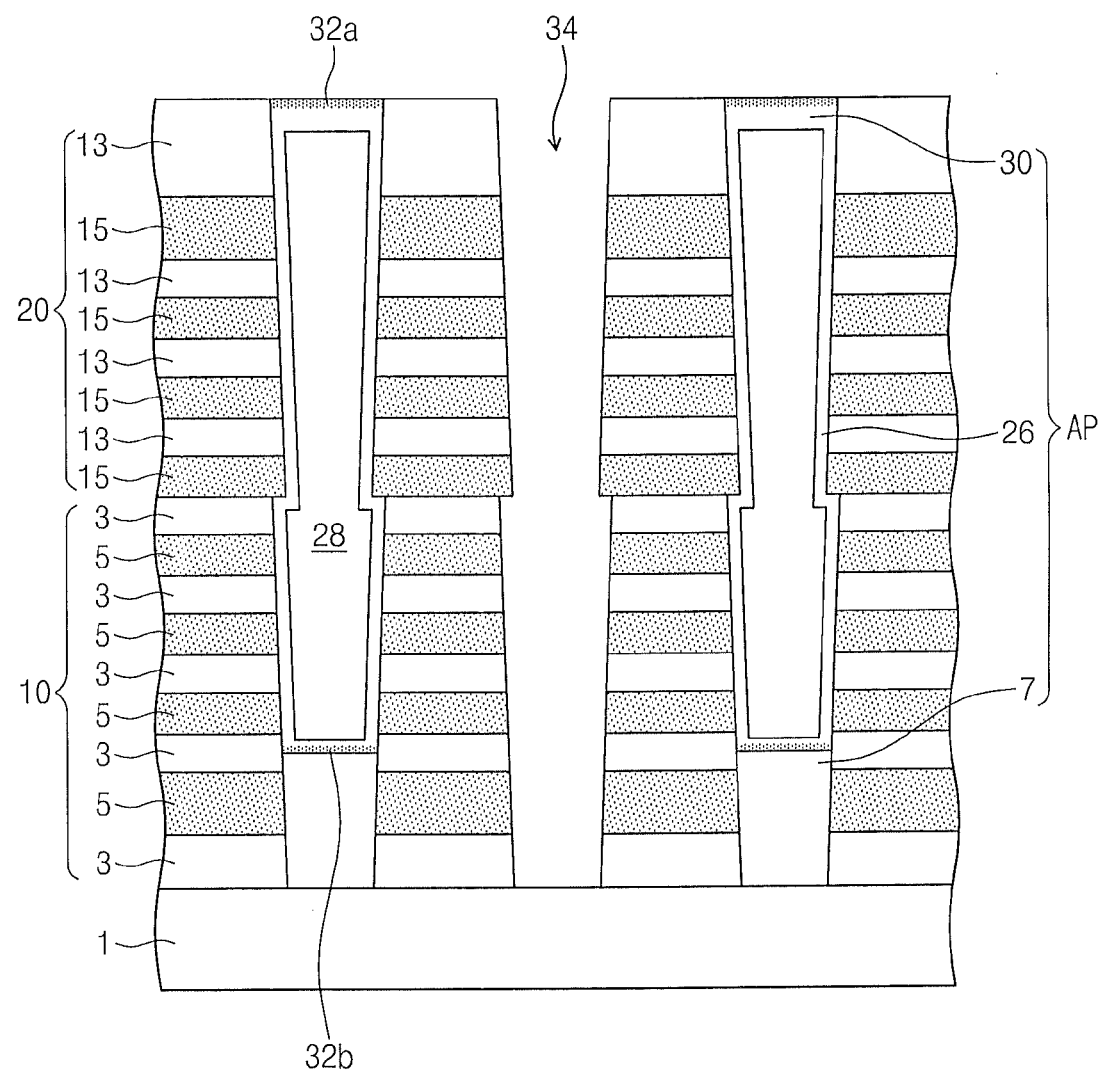

FIGS. 17 to 19 are cross-sectional views illustrating methods of fabricating the semiconductor device of FIG. 15 according to some embodiments of the inventive concepts.

Referring to FIG. 17, a first preliminary stack structure 10 is formed on a substrate 10. The first preliminary stack structure 10 is patterned to form a first active hole H1 and a first sub-groove G1 spaced apart from each other. The first sub-groove G1 has a linear shape. A first sacrificial line 8 is formed in the first sub-groove G1. An active plug 7 is formed in the first active hole H1. A first sacrificial plug 9 is formed to fill the first active hole H1 on the active plug 7. A second preliminary stack structure 20 is formed on the first preliminary stack structure 10. The second preliminary stack structure 20 is patterned to form a second active hole H2 and a second sub-groove G2 that overlap with the first active hole H1 and the first sub-groove G1, respectively. A sacrificial layer is formed to fill the second active hole H2 and the second sub-groove G2 and then the sacrificial layer is planarized to form a second sacrificial plug 19 and a second sacrificial line 18 in the second active hole H2 and the second sub-groove G2, respectively.

Referring to FIG. 18, the sacrificial plugs 9 and 19 in the active holes H1 and H2 are selectively removed. As described with reference to FIG. 16, the active layer 26, the first filling insulation pattern 28 and the active pad 30 are formed in the active holes H1 and H2. As described with reference to FIGS. 8 and 9, the metal silicide layer 32 is formed on the active pad 30 and then an unreacted metal layer is removed. Subsequently, the annealing process is performed to perform the metal induced lateral crystallization process. Thus, high-concentration regions 32a and 32b are formed within the active pillar AP.

Referring to FIG. 19, the sacrificial lines 8 and 18 in the sub-grooves G1 and G2 are selectively removed to form a groove 34. The sacrificial layers 5 and 15 are selectively removed through the groove 34. Subsequently, a gate insulating layer 24 is conformally formed and then a metal layer is formed to fill spaces between the intergate insulating layers 3 and 13. The metal layer in the groove 34 is removed to form conductive lines LSL, WL and USL. The metal layer in the groove 34 may be removed using a mask including an opening having a wider width than the groove 34. Thereafter, subsequent processes of the present embodiments may be the same as or similar to corresponding processes of the embodiments described with respect to FIG. 3.

Figure 20:
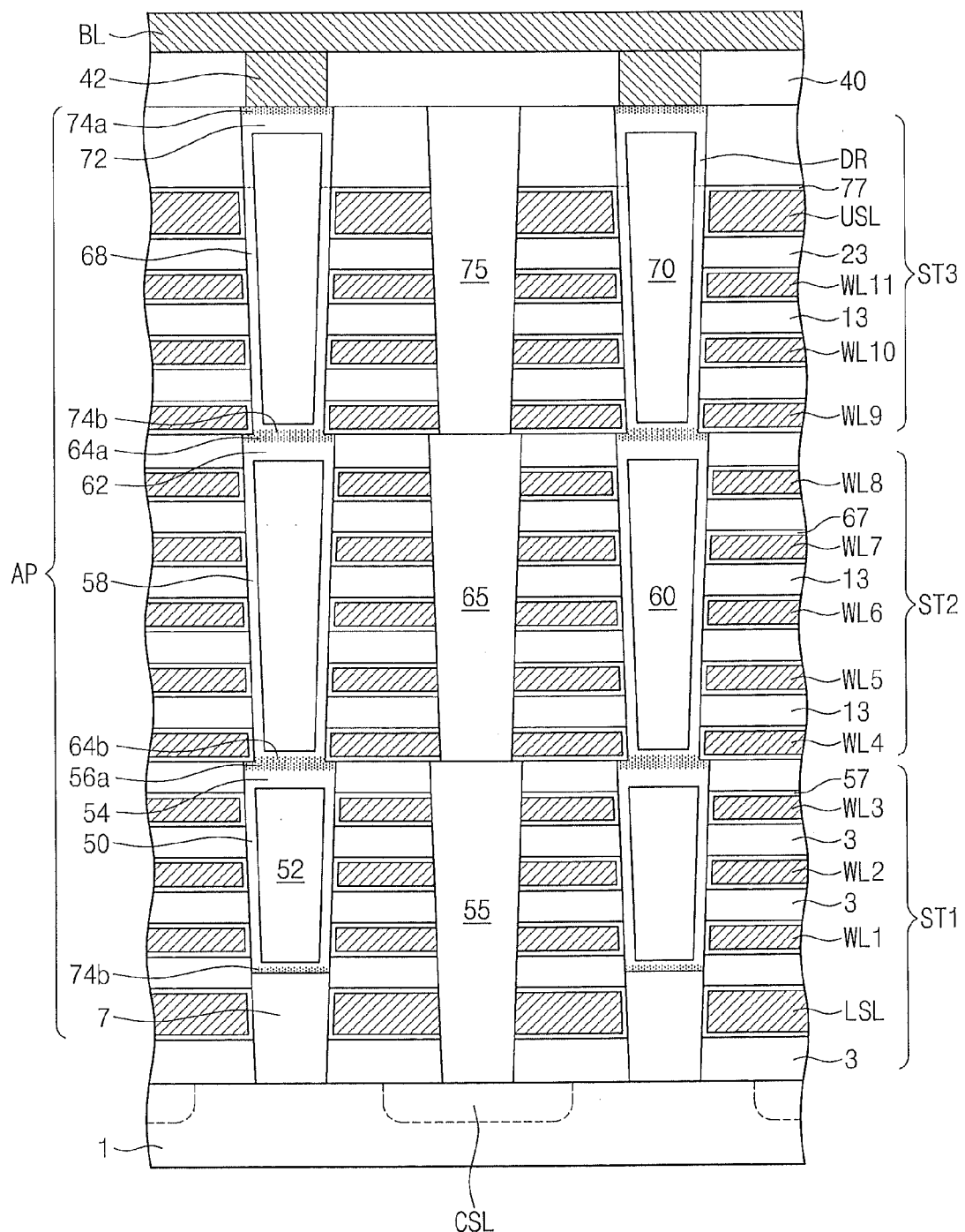
FIG. 20 is a cross-sectional view illustrating a semiconductor device according to some embodiments of the inventive concepts.

FIG. 20 is a cross-sectional view illustrating a semiconductor device according to some embodiments of the inventive concepts.

Referring to FIG. 20, three sub-stack structures ST1, ST2 and ST3 are sequentially stacked on a substrate 1 in a semiconductor device according to the present embodiments. Each of the sub-stack structures ST1 to ST3 includes conductive lines LSL, WL and/or USL and intergate insulating layers 3, 13 or 23 that are alternately stacked. An active pillar AP penetrates the sub-stack structures ST1 to ST3. The active pillar AP includes an active plug 7, a first active shell 50, a first active pad 54, a second active shell 58, a second active pad 62, a third active shell 68, and a third active pad 72 that are sequentially stacked. The insides of the active shells 50, 58 and 68 are filled with first, second and third filling insulation patterns 52, 60 and 70, respectively. The active pillar AP includes high-concentration regions 56a, 56b, 64a, 64b, 74a and 74b. The sub-stack structures ST1, ST2 and ST3 includes first, second and third filling insulation lines 55, 65 and 75 spaced apart from the active pillar AP, respectively. Other elements of the semiconductor device according to the present embodiments may be the same as or similar to corresponding elements of the semiconductor device according to the embodiments described with respect to FIG. 3.

FIGS. 21 to 27 are cross-sectional views illustrating methods of fabricating the semiconductor device of FIG. 20.

Figure 21:
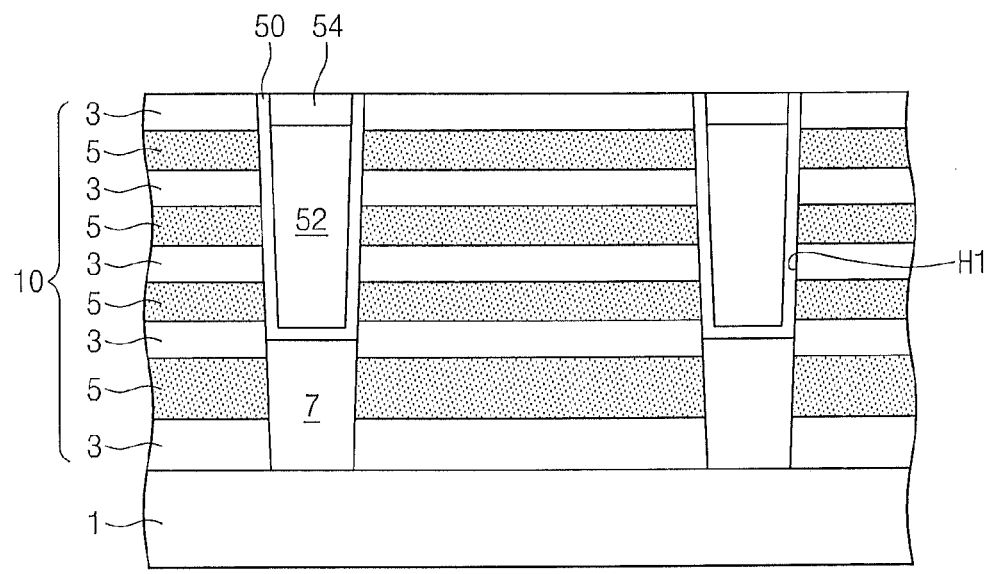
FIGS. 21 to 27 are cross-sectional views illustrating methods of fabricating the semiconductor device of FIG. 20.

Referring to FIG. 21, a first preliminary stack structure 10 is formed on a substrate 1. The first preliminary stack structure 10 is patterned to form a first active hole H1 exposing the substrate 1. An active plug 7 is formed in a lower portion of the first active hole H1. Subsequently, a first active shell 50, a first filling insulation pattern 52 and a first active pad 54 are formed. The first active shell 50 covers a sidewall of the first active hole H1, and the first filling insulation pattern 52 may partially fill the inside of the first active shell 50. The first active pad 54 is formed on the first active shell 50 and the first filling insulation pattern 52.

Figure 22:
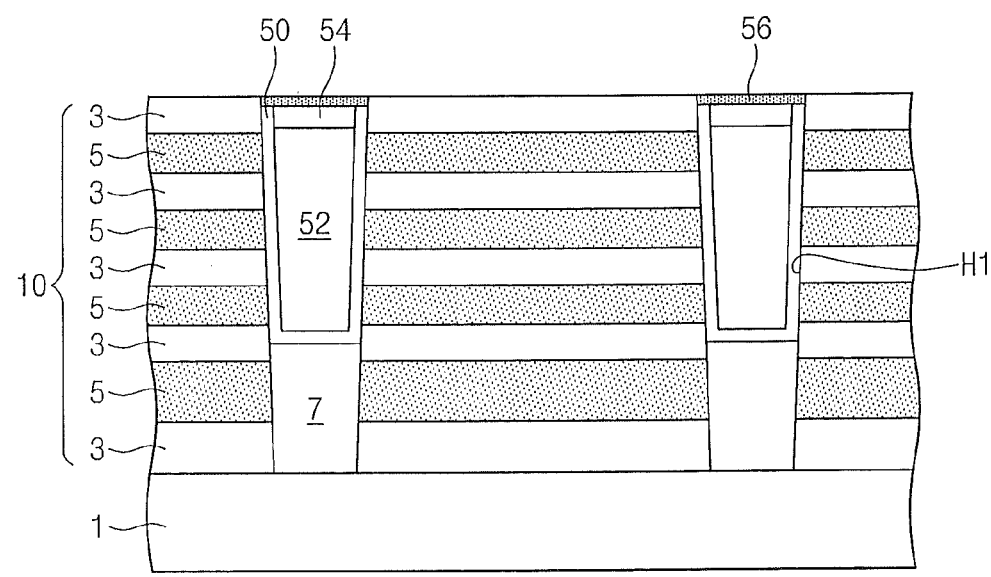

Referring to FIG. 22, a metal layer is deposited and then the deposited metal layer is thermally treated to form a first metal silicide layer 56 on the first active shell 50 and the first active pad 54. Subsequently, an unreacted metal layer is removed.

Figure 23:
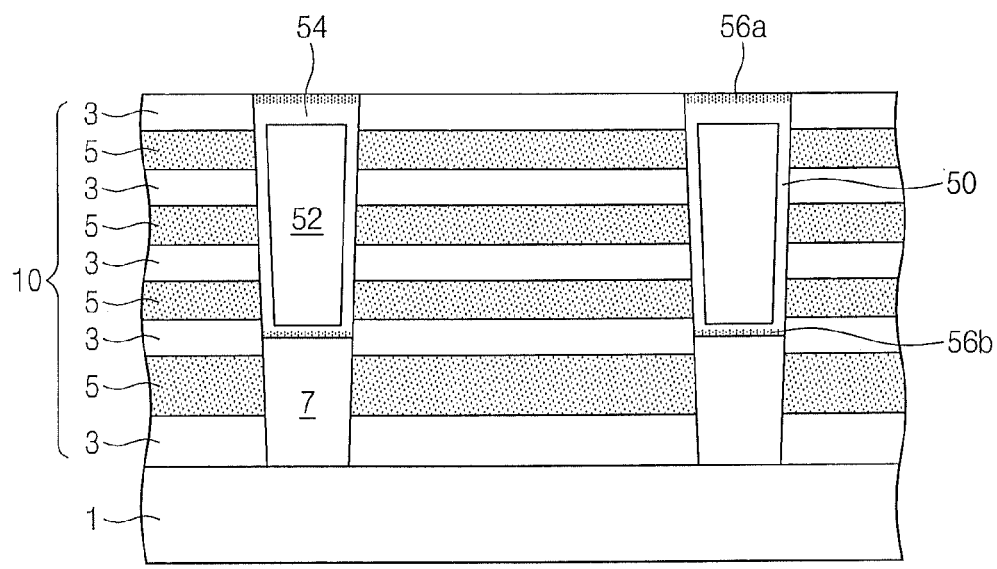

Referring to FIG. 23, a metal induced lateral crystallization method is performed using an annealing process. Thus, first and second high-concentration regions 56a and 56b may be formed.

Figure 24:
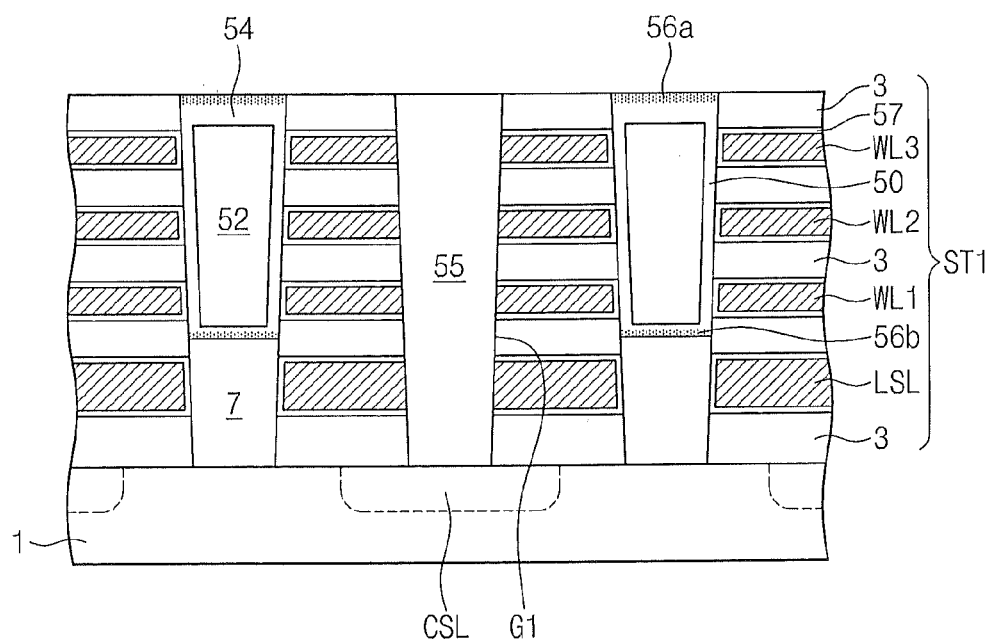

Referring to FIG. 24, a portion of the first preliminary stack structure 10 spaced apart from the first active shell 50 is patterned to form a first groove G1 and then first sacrificial layers 5 are removed through the first groove G1. A common source line CSL is formed in the substrate 1 under the first groove G1. A first gate insulating layer 57 is conformally formed and then a metal layer is formed to fill spaces between first intergate insulating layers 3. The metal layer in the first groove G1 is removed and then a first filling insulation line 55 is formed in the first groove G1. Thus, a first sub-stack structure ST1 may be formed.

Figure 25:
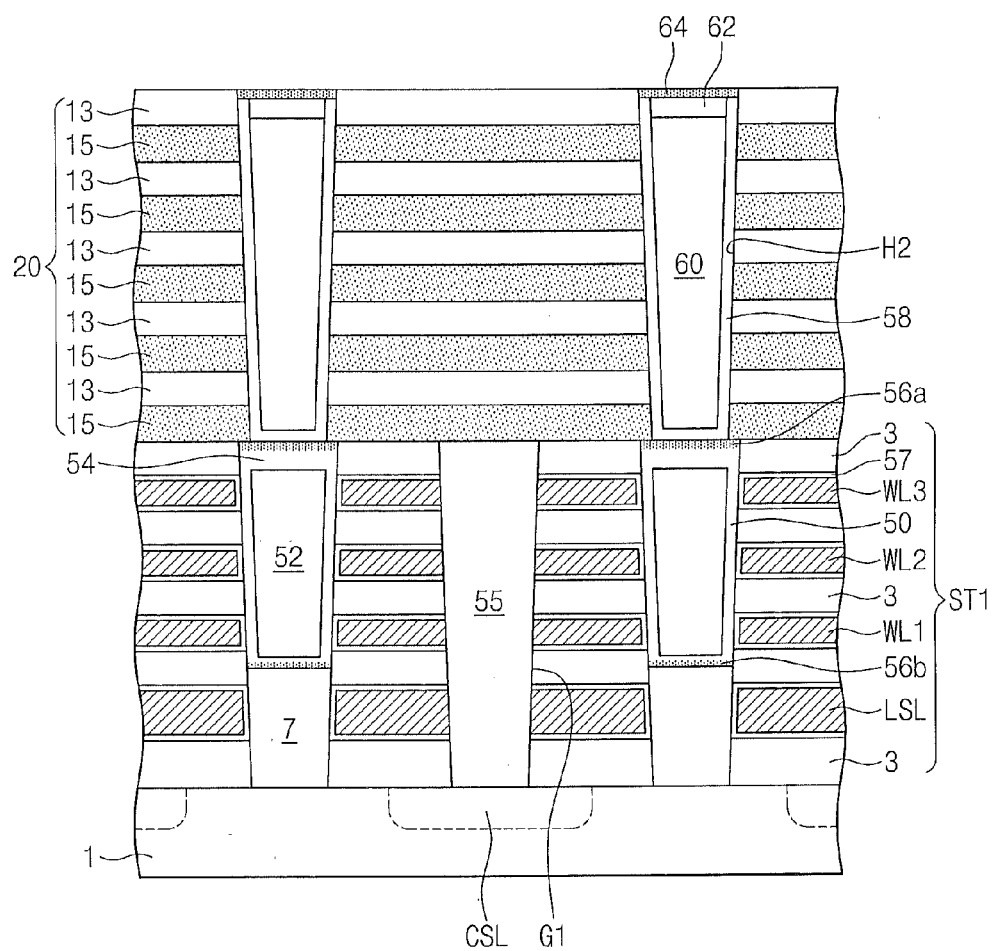

Referring to FIG. 25, a second preliminary stack structure 20 is formed on the first sub-stack structure ST1. The second preliminary stack structure 20 is patterned to form a second active hole H2 exposing the first active pad 54. Thereafter, a second active shell 58, a second filling insulation pattern 60, and a second active pad 62 are formed. The second active shell 58 covers a sidewall of the second active hole H2, and the second filling insulation pattern 60 partially fills the inside of the second active shell 58. The second active pad 62 is formed on the second active shell 58 and the second filling insulation pattern 60. A metal layer is deposited and then the deposited metal layer is thermally treated to form a second metal silicide layer 64 on the second active shell 58 and the second active pad 62. Subsequently, an unreacted metal layer is removed.

Figure 26:
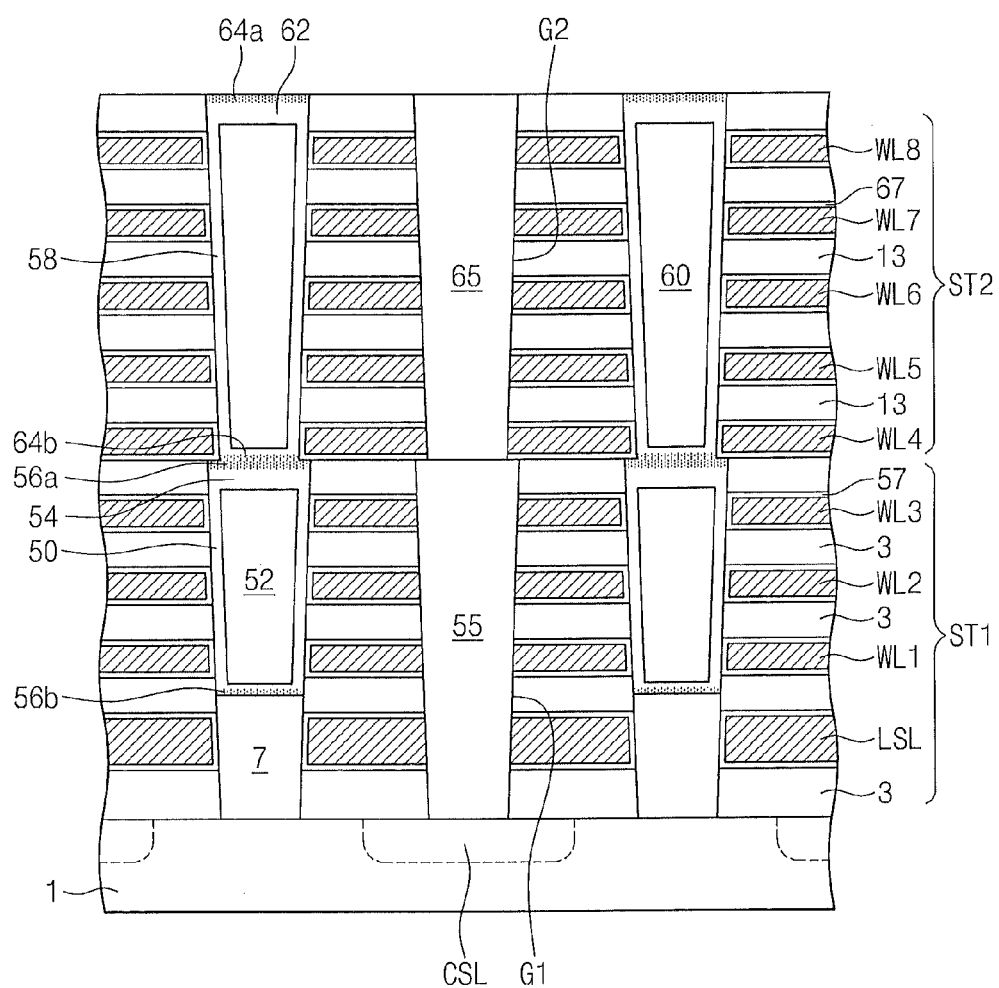

Referring to FIG. 26, a metal induced lateral crystallization method is performed using an annealing process. Thus, third and fourth high-concentration regions 64a and 64b. Since the first active pad 54 was crystallized previously, diffused crystallization inducing metal atoms may be blocked by a top surface of the first active pad 54. Thus, the fourth high-concentration region 64b may be formed. A portion of the second preliminary stack structure 20 spaced apart from the second active shell 58 is patterned to form a second groove G2 and then second sacrificial layers 15 are removed through the second groove G2. A second gate insulating layer 67 is conformally formed and then a metal layer is formed to fill spaces second intergate insulating layers 13. The metal layer in the second groove G2 is removed and then a second filling insulation line 65 is formed in the second groove G2. Thus, a second sub-stack structure ST2 may be formed.

Figure 27:
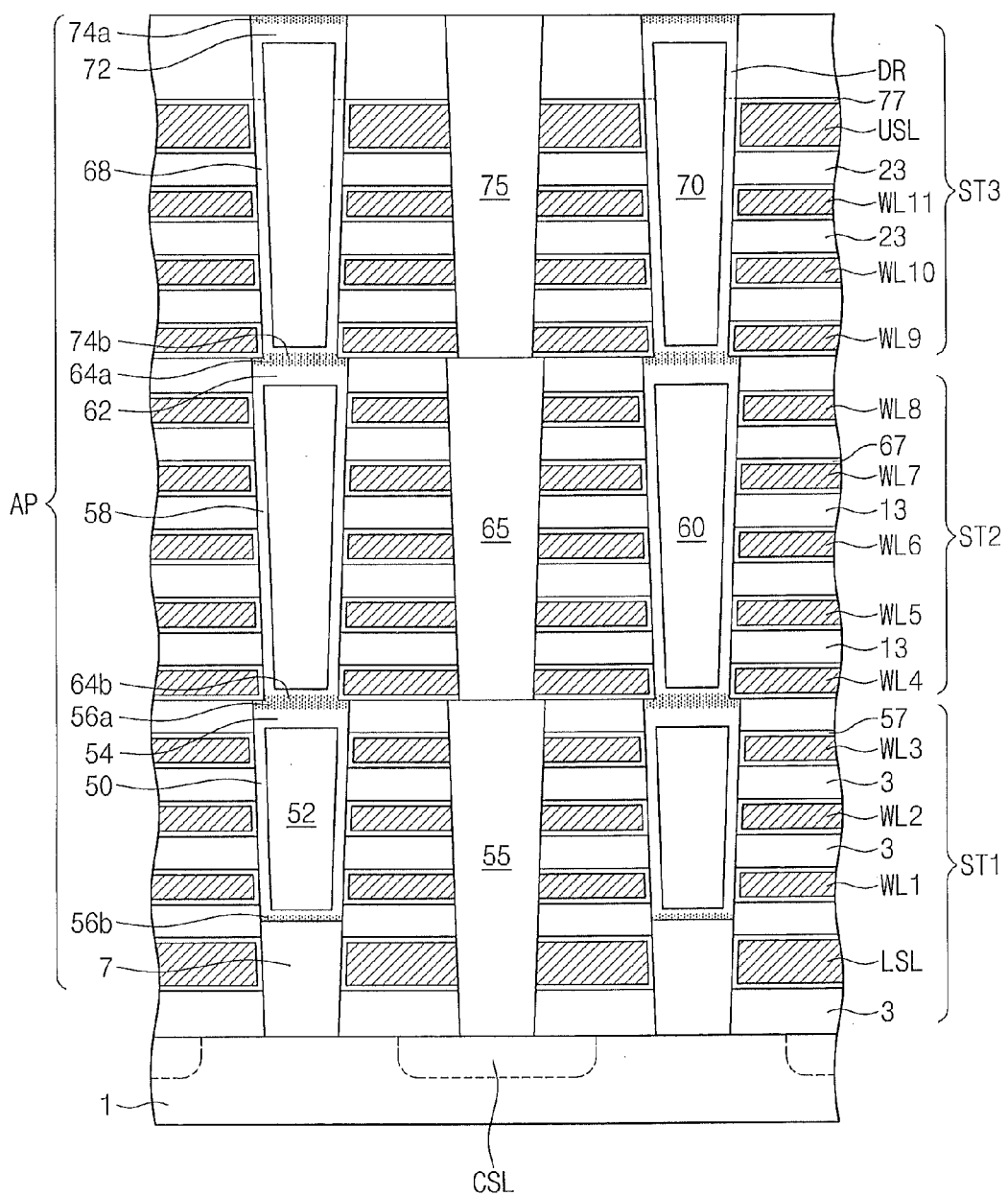

Referring to FIG. 27, the manufacture method of the second sub-stack structure ST2 is repeated to form a third sub-stack structure ST3. Other fabricating processes may be the same as or similar to corresponding processes of the embodiments described with respect to FIG. 3.

Figure 28:
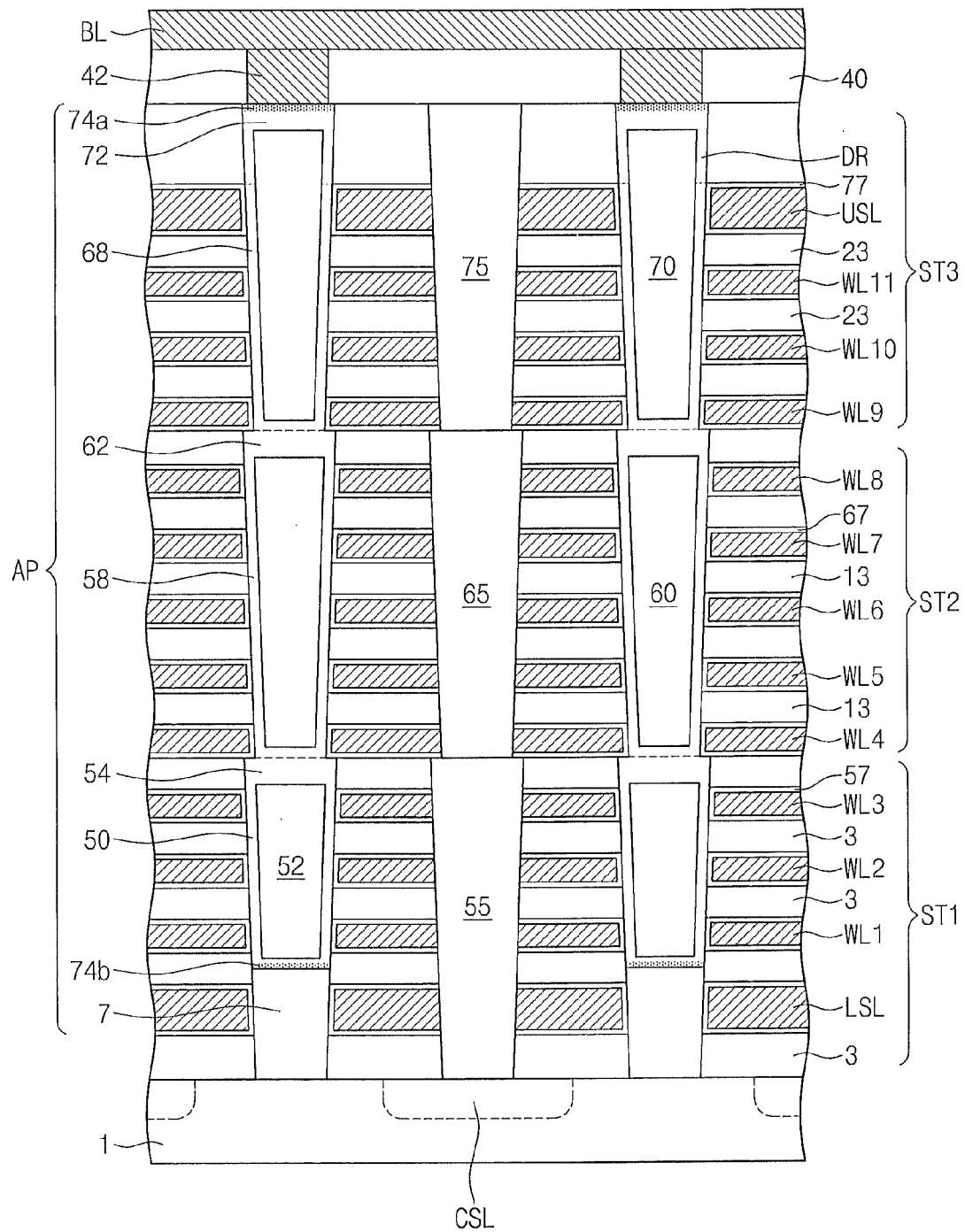
FIG. 28 is a cross-sectional view illustrating a semiconductor device according to some embodiments of the inventive concepts.

FIG. 28 is a cross-sectional view illustrating a semiconductor device according to some embodiments of the inventive concepts.

Referring to FIG. 28, in a semiconductor device according to the present embodiments, high-concentration regions 74a and 74b are disposed at the bottom surface of the first active shell 50 and the top surface of the third active pad 72, respectively. There is no high-concentration region in the active pillar AP between the high-concentration regions 74a and 74b. Other elements of the semiconductor device according to the present embodiments may be the same as or similar to corresponding elements of the semiconductor device according to embodiments described with respect to FIG. 20.

Figure 29:
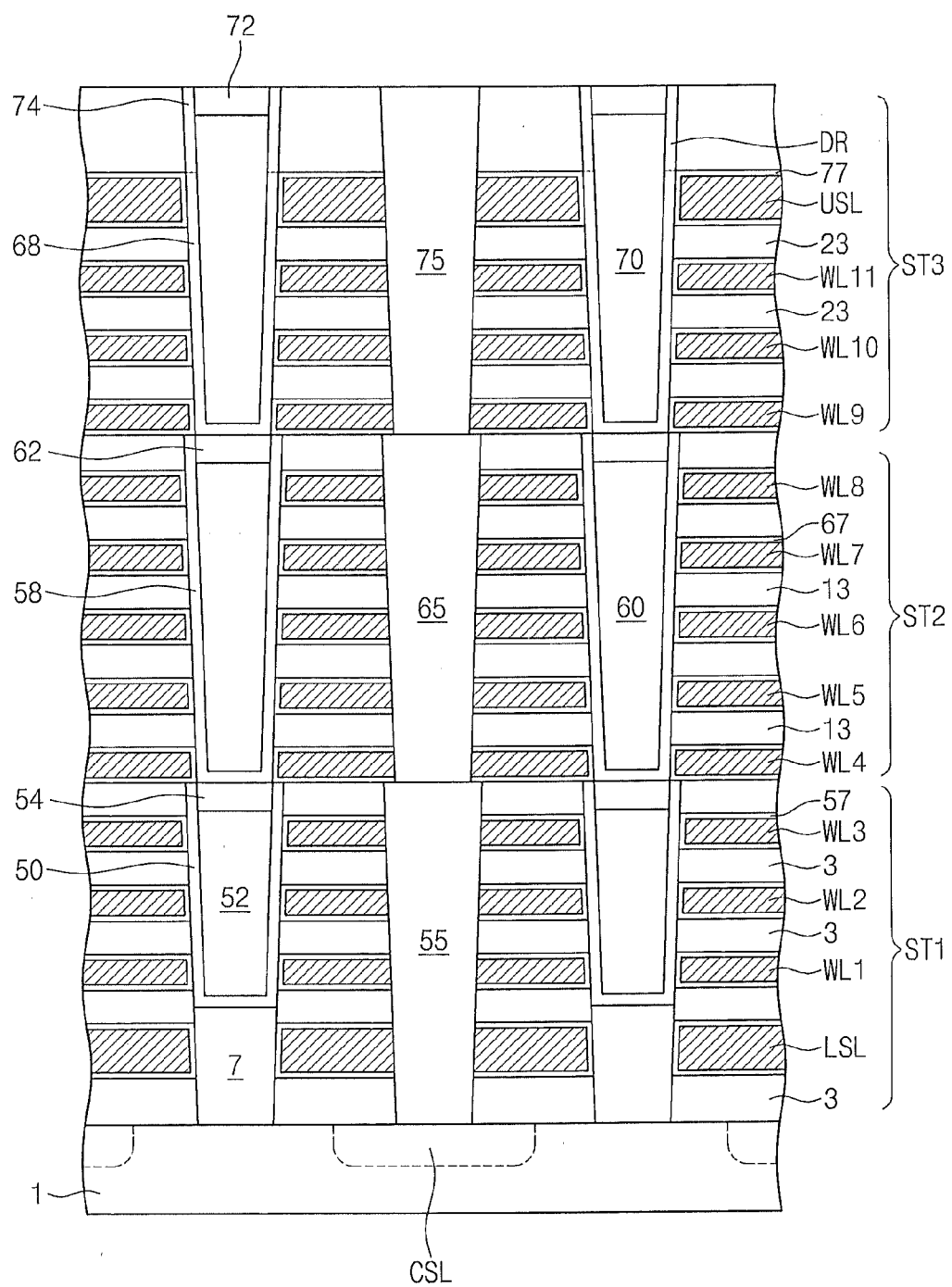
FIGS. 29 to 31 are cross-sectional views illustrating methods of fabricating the semiconductor device of FIG. 28.
Figure 30:
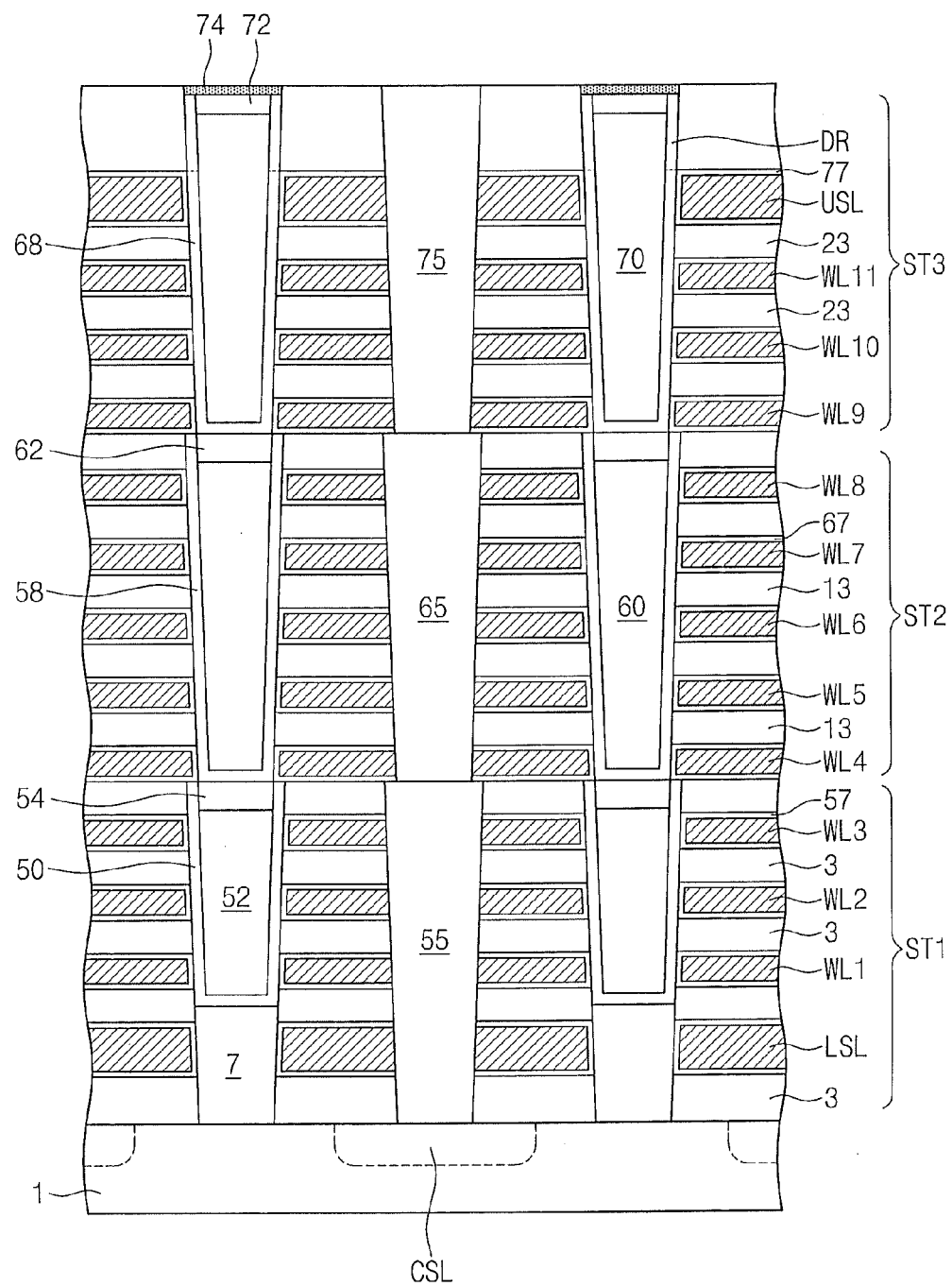
Figure 31:
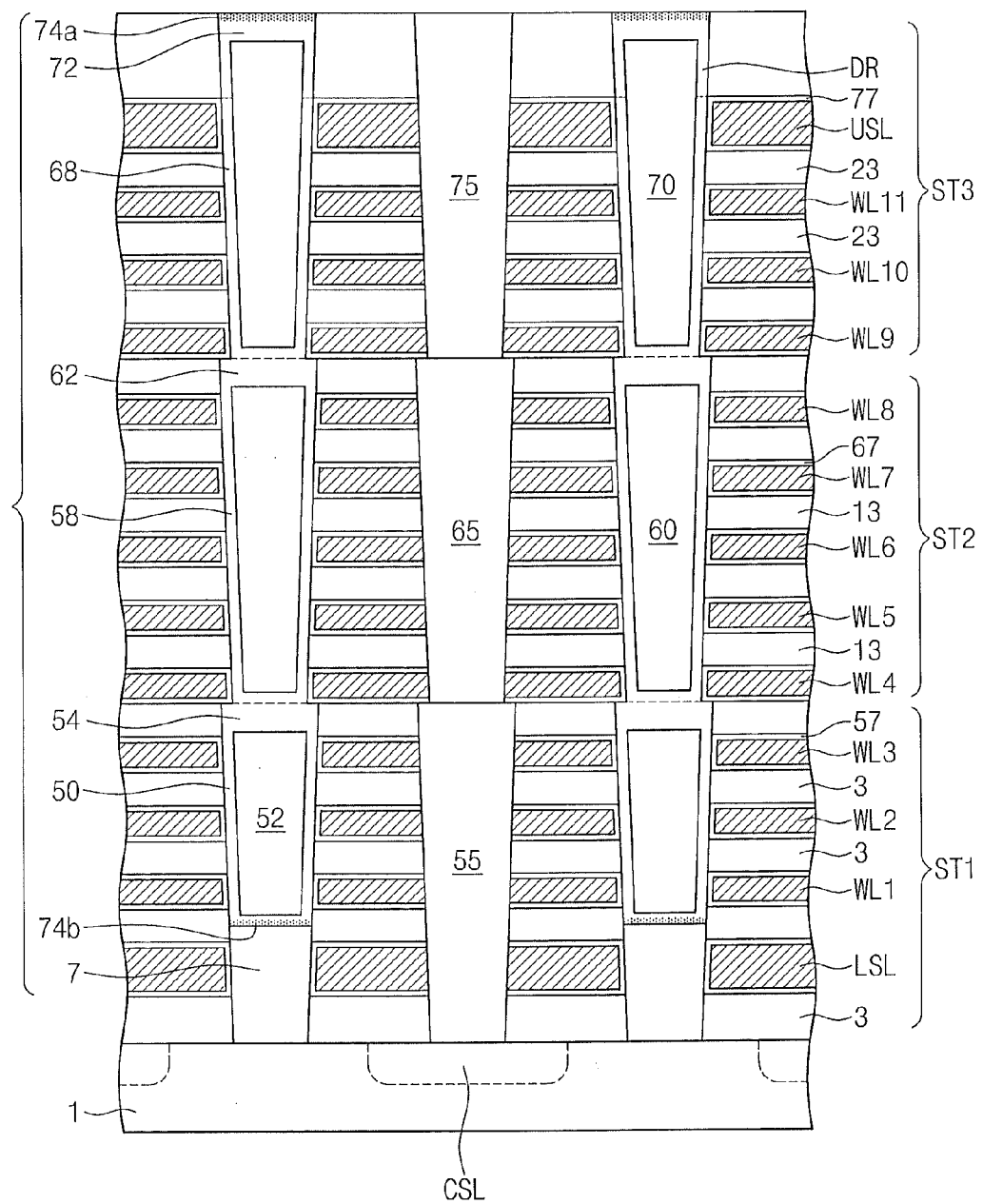

FIGS. 29 to 31 are cross-sectional views illustrating methods of fabricating the semiconductor device of FIG. 28.

Referring to FIG. 29, first to third sub-stack structures ST1 to ST3 are formed by a similar fabricating method to the fabricating method described in the embodiments described with respect to FIG. 20. However, the first and second metal silicide layers 56 and 64 are not formed on the first and second active pads 56 and 62 and the annealing processes of the first and second metal silicide layers 56 and 62 are not performed.

Referring to FIG. 30, a metal silicide layer 74 is formed on the third active shell 68 and the third active pad 72.

Referring to FIG. 31, an annealing process is performed to diffuse a crystallization inducing metal included in the metal silicide layer 74 into the active pillar AP, thereby performing crystallization of the active pillar AP. At this time, since the first to third active pads 54, 62 and 72 and the first to third active shells 50, 58 and 68 are not crystallized, the crystallization inducing metal may be diffused through the active pads 54, 62 and 72 and the active shells 50, 58 and 68 to induce the crystallization. The diffused crystallization inducing metal may be blocked by the single-crystalline active plug 7, so that a second high-concentration region 74b may be formed. Other fabricating processes of the present embodiments may be the same as or similar to corresponding processes of the embodiments described with respect to FIG. 20.

Figure 32:
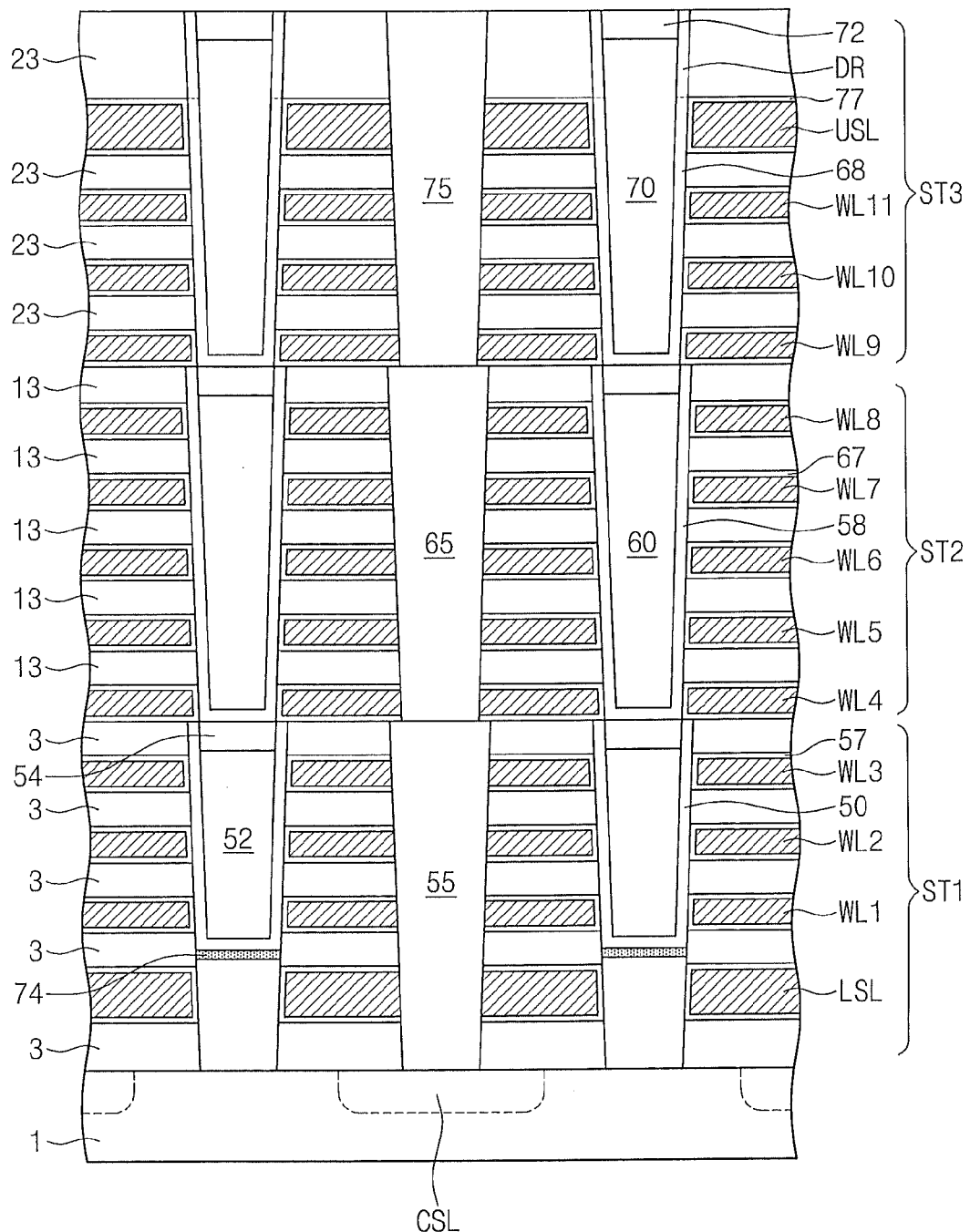
FIG. 32 is a cross-sectional view illustrating methods of fabricating the semiconductor device of FIG. 28 according to some embodiments of the inventive concepts.

FIG. 32 is a cross-sectional view illustrating methods of fabricating the semiconductor device of FIG. 28 according to some embodiments of the inventive concepts.

Referring to FIGS. 28 and 32, first to third sub-stack structures ST1 to ST3 are formed by a similar fabricating method to the fabricating method described in the embodiments described with respect to FIG. 20. However, the first to third metal silicide layers 56, 64 and 74 are not formed on the first to third active pads 54, 62 and 72 and the annealing processes are also not performed. In the present embodiments, a metal silicide layer 74 is formed on the active plug 7 and then an annealing process is performed. A crystallization inducing metal contained in the metal silicide layer 74 is not diffused to the active plug 7 having a single-crystalline structure but is diffused into active shells 50, 58 and 68 and active pads 54, 62 and 72 to perform crystallization. Other fabricating processes of the present embodiments may be the same as or similar to corresponding processes of the embodiments described with respect to FIG. 20.

Figure 33:
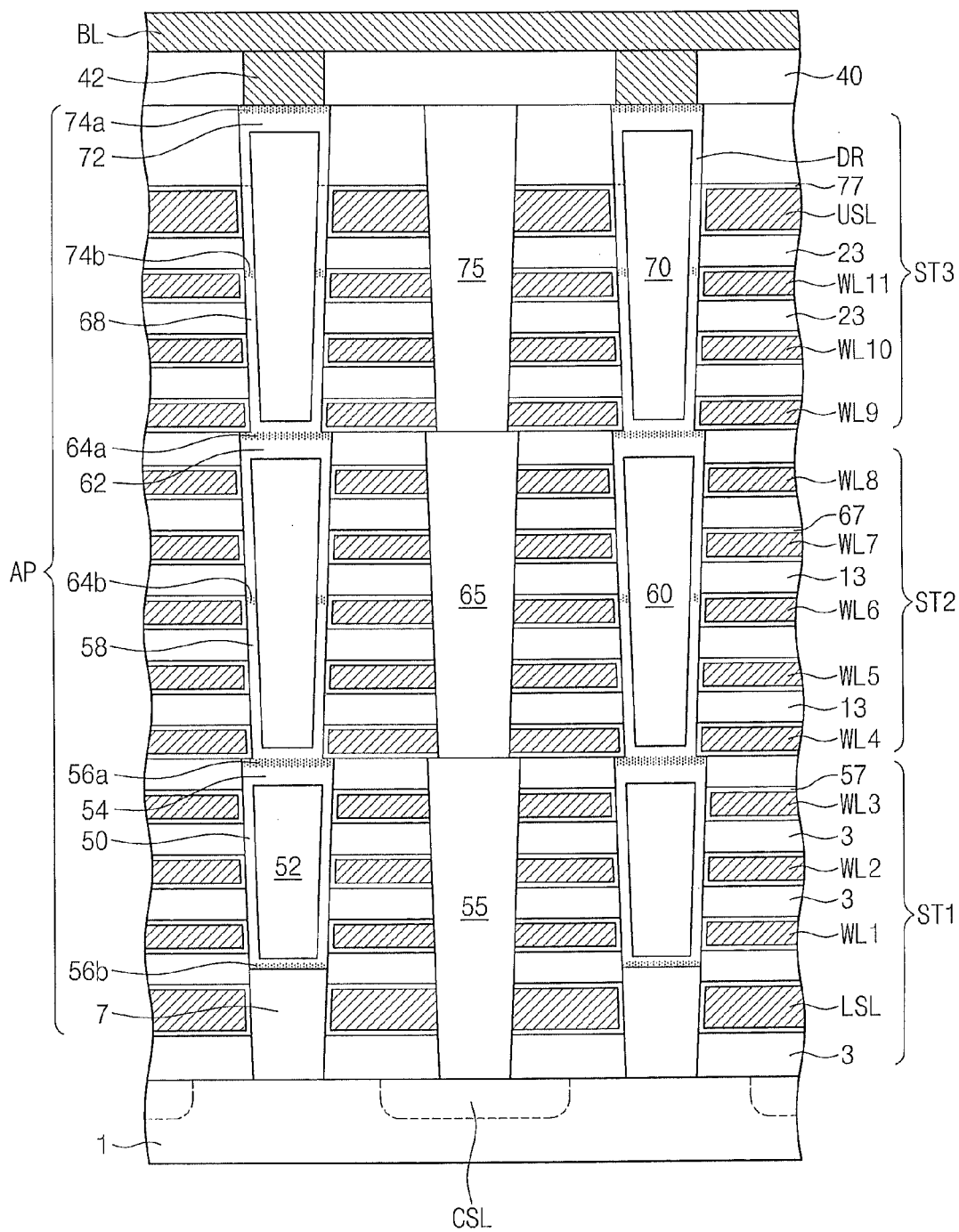
FIG. 33 is a cross-sectional view illustrating a semiconductor device according to some embodiments of the inventive concepts.

FIG. 33 is a cross-sectional view illustrating a semiconductor device according to some embodiments of the inventive concepts.

Referring to FIG. 33, in a semiconductor device according to the present embodiments, high-concentration regions 74a, 74b, 64a, 64b, 56a and 56b may be disposed to be adjacent the top surface of the third active pad 72, a middle portion of the third active shell 68, the top surface of the second active pad 62, a middle portion of the second active shell 58, the top surface of the first active pad 54, and the bottom surface active shell 50, respectively. Other elements of the semiconductor device according to the present embodiments may be the same as or similar to corresponding elements of the semiconductor device according to the embodiments described with respect to FIG. 20.

Figure 34:
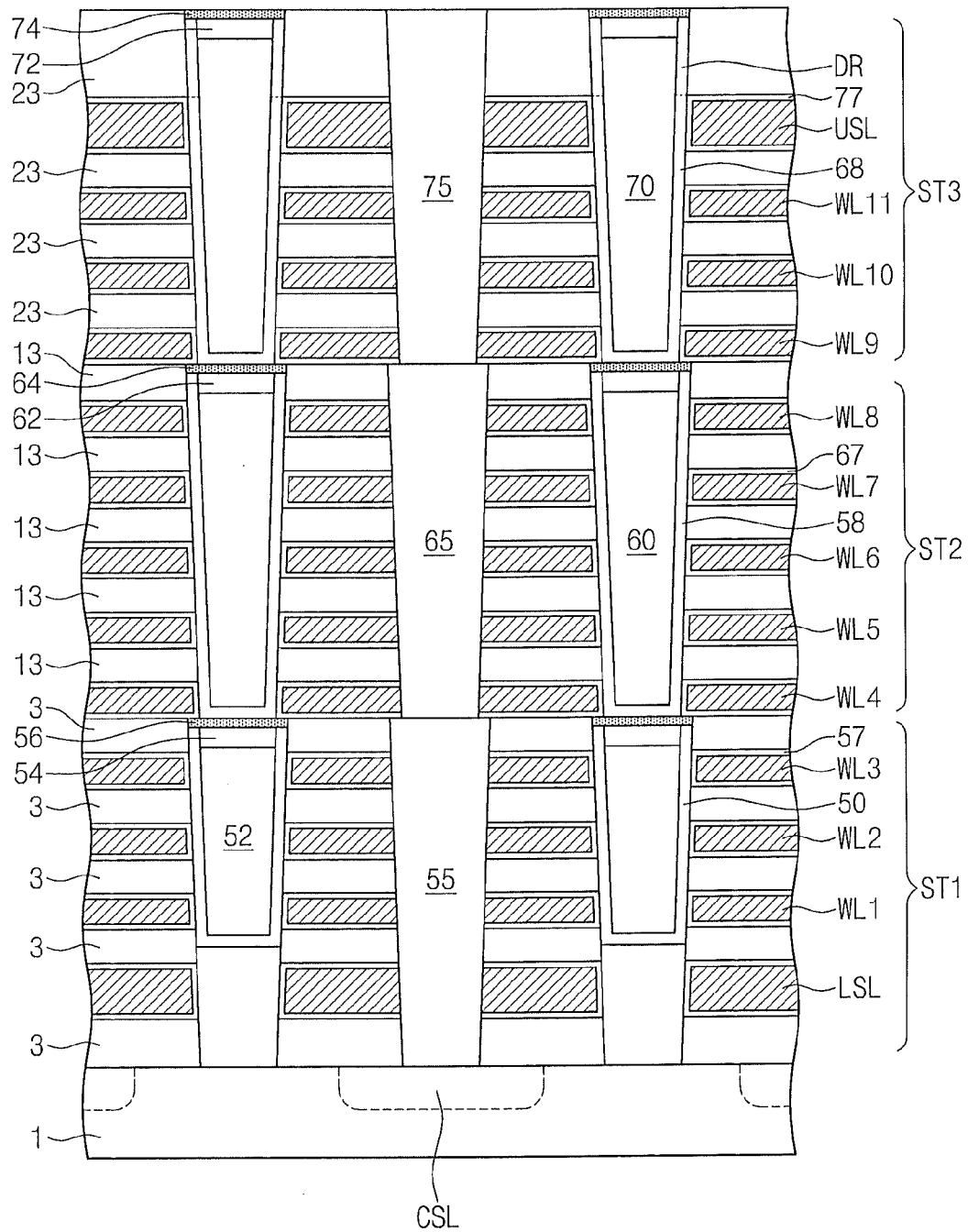
FIG. 34 is a cross-sectional view illustrating methods of fabricating the semiconductor device of FIG. 33.

FIG. 34 is a cross-sectional view illustrating methods of fabricating the semiconductor device of FIG. 33.

Referring to FIG. 34, sub-stack structures ST1 to ST3 are formed by a similar fabricating method to the fabricating method described in the embodiments described with respect to FIG. 20. At this time, the first to third metal silicide layers 56, 64 and 74 are formed on the first to third active pads 54, 62 and 72, respectively, but the annealing processes are not performed.

Referring again to FIG. 33, an annealing process is performed to diffuse the crystallization inducing metals contained in the metal silicide layers 56, 64 and 74. At this time, the crystallization inducing metal in the first metal silicide layer 56 may be diffused into the first active shell 50 and the second active shell 58 at the same time to perform the crystallization. At the same time, the crystallization inducing metal in the second metal silicide layer may be diffused into the second and third active shells 58 and 68 at the same time to perform the crystallization. At the same time, the crystallization inducing metal in the third metal silicide layer 74 may be diffused into the third active shell 68 to perform the crystallization. Thus, the downward diffused crystallization inducing metal may meet the upward diffused crystallization inducing metal at a middle portion of each of the second and third active shells 58 and 68. Since portions on and under the middle portion of each of the second and third active shells 58 and 68 were crystallized previously, the crystallization inducing metal in the middle portion of each of the second and third active shells 58 and 68 may not be diffused but may remain. Thus, the high-concentration regions 64b and 74b may be formed in the middle portions of the second and third active shells 58 and 68. Other fabricating processes of the present embodiments may be the same as or similar to corresponding processes of the embodiments described with respect to FIG. 20.

Figure 35:
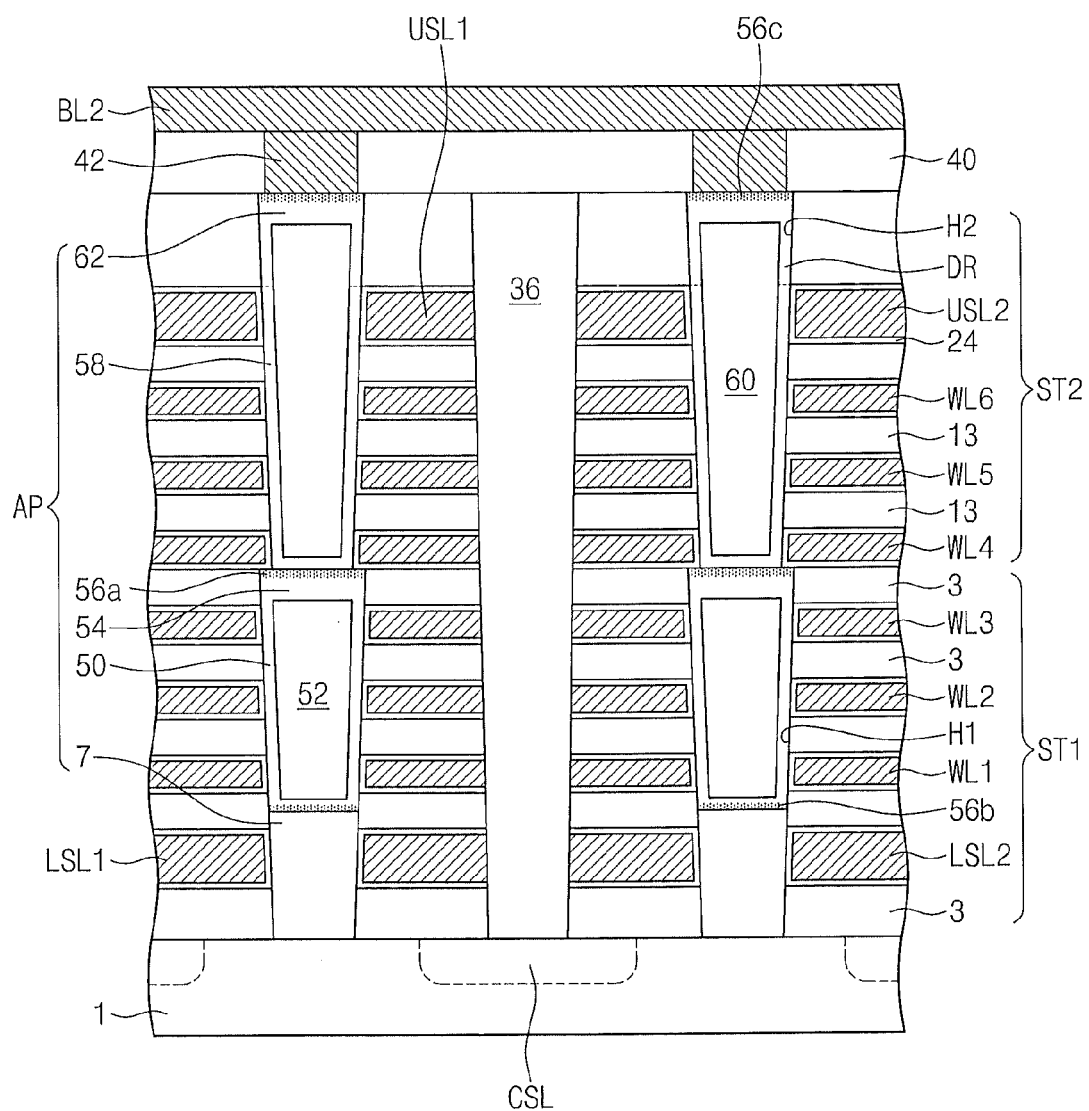
FIG. 35 is a cross-sectional view illustrating a semiconductor device according to some embodiments of the inventive concepts.

FIG. 35 is a cross-sectional view illustrating a semiconductor device according to some embodiments of the inventive concepts.

Referring to FIG. 35, first and second sub-stack structures ST1 and ST2 are stacked on a substrate 1 in a semiconductor device according to the present embodiments. High-concentration regions 56b, 56a and 56c are disposed to be adjacent the bottom surface of the first active shell 50, the top surface of the first active pad 54, and the top surface of the second active pad 62, respectively. Other elements of the semiconductor device according to the present embodiments may be the same as or similar to corresponding elements of the semiconductor device illustrated in FIG. 15.

Figure 36:
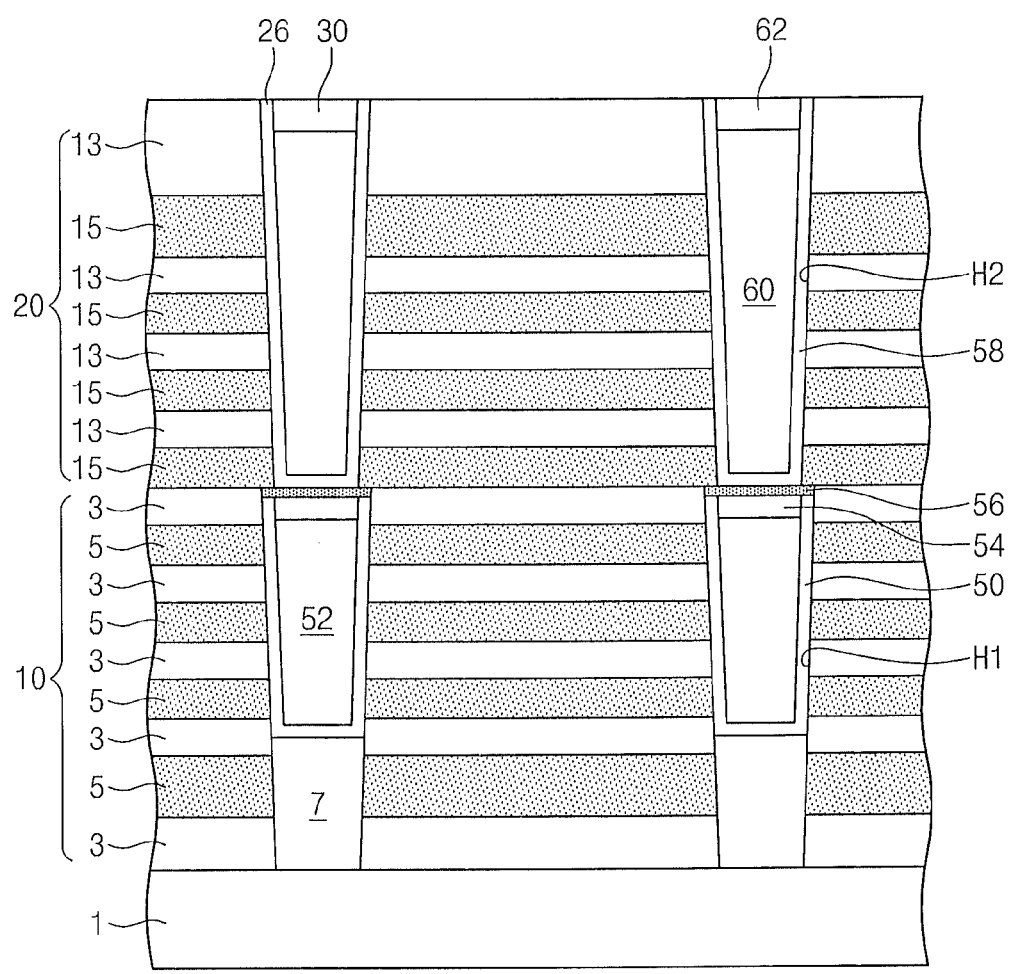
FIG. 36 is a cross-sectional view illustrating methods of fabricating the semiconductor device of FIG. 35.

FIG. 36 is a cross-sectional view illustrating methods of fabricating the semiconductor device of FIG. 35.

Referring to FIG. 36, preliminary stack structures 10 and 20 are formed on a substrate 1 and active shells 50 and 58 are formed to penetrate the preliminary stack structures 10 and 20, respectively. Active pads 54 and 62 are formed on the active shells 50 and 58, respectively. A metal silicide layer 56 is formed on the first active pad 54 but is not formed on the second active pad 62. A subsequent annealing process is performed. Other fabricating processes of the present embodiments may be the same as or similar to corresponding processes of the embodiments described with respect to FIG. 20.

Figure 37:
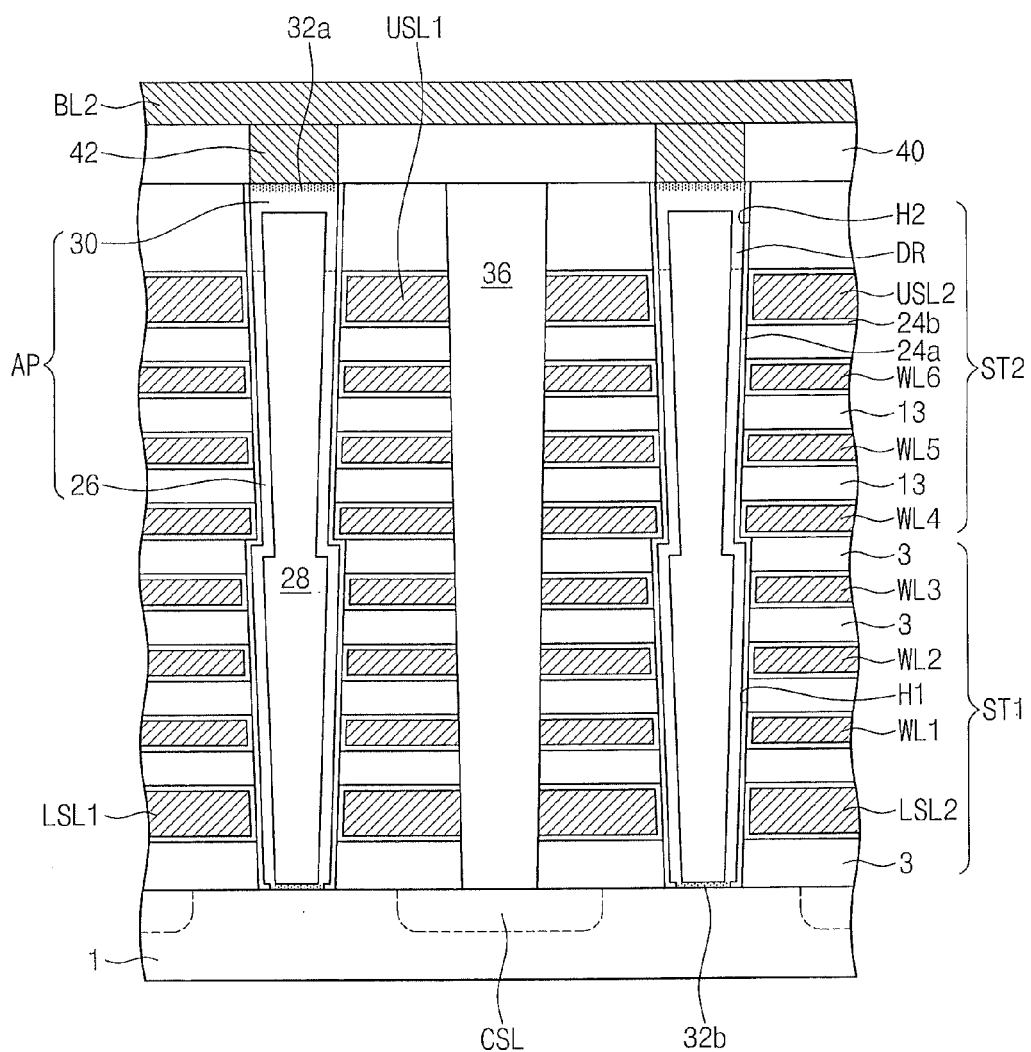
FIG. 37 is a cross-sectional view illustrating a semiconductor device according to some embodiments of the inventive concepts.

FIG. 37 is a cross-sectional view illustrating a semiconductor device according to some embodiments of the inventive concepts.

Referring to FIG. 37, an active pillar AP does not include the active plug 7 in a semiconductor device according to the present embodiments. An active shell 26 is in direct contact with the substrate 1. A second high-concentration region 32b is disposed to be adjacent a bottom surface of the active shell 26, which is contact with the substrate 1. Other elements of the semiconductor device according to the present embodiments may be the same as or similar to corresponding elements of the semiconductor device according to the embodiments described with respect to FIG. 3.

In methods of fabricating the semiconductor device of FIG. 37, the sacrificial plug 9 is formed to fill the first active hole H1 of FIG. 4 without the formation of the active plug 7. Thereafter, subsequent processes that are the same as or similar to corresponding processes of the embodiments described with respect to FIG. 3 may be performed.

In the methods of fabricating the semiconductor device according to embodiments of the inventive concepts, the sub-stack structures having a predetermined height and the active holes may be repeatedly stacked to reduce or improve the cell dispersion. Additionally, various errors such as a not-open error caused in an etch process may be prevented. Moreover, the grain size of the active pillar used as channels may be increased or maximized using the metal induced lateral crystallization method to improve the cell current. Furthermore, the formation position of the crystallization inducing metal may be controlled, so that a concentration grade of the crystallization inducing metal in the active pillar may be controlled depending on its position within the active pillar.

Figure 38:
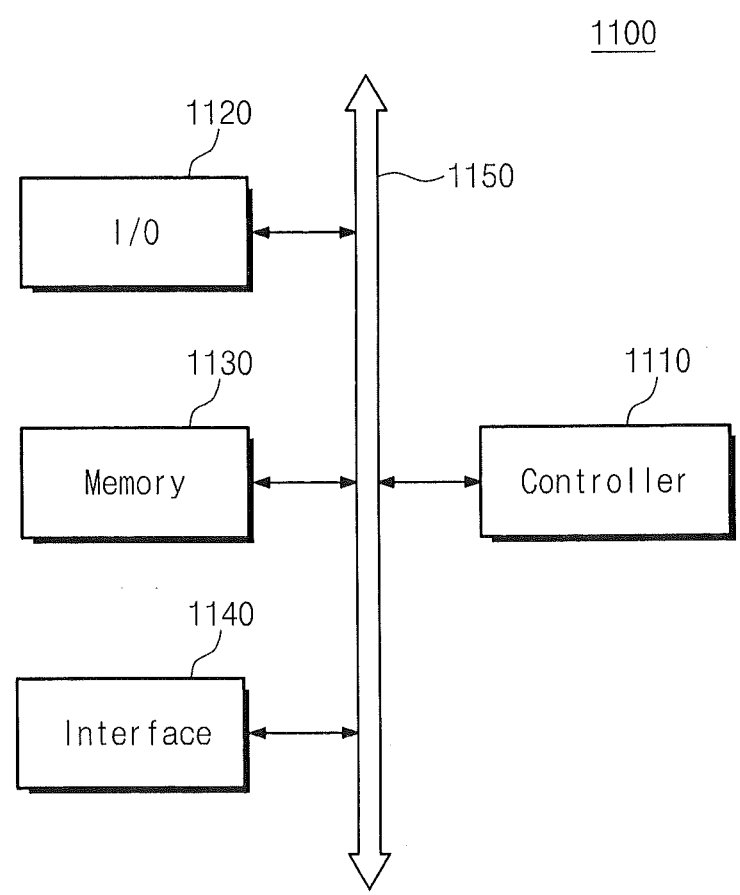
FIG. 38 is a schematic block diagram illustrating an example of memory systems including three-dimensional semiconductor devices according to some embodiments of the inventive concepts.

FIG. 38 is a schematic block diagram illustrating an example of memory systems including three-dimensional semiconductor devices according to some embodiments of the inventive concepts.

Referring to FIG. 38, a memory system 1100 may be applied to a personal digital assistant (PDA), a portable computer, a web tablet, a wireless phone, a mobile phone, a digital music player, a memory card and/or other electronic products. The other electronic products may receive or transmit information data by wired and/or wireless data communication techniques.

The memory system 1100 may include a controller 1110, an input/output (I/O) unit 1120 (e.g., a keypad, keyboard and/or a display device), a memory device 1130, an interface unit 1140 and a data bus 1150. At least two of the controller 1110, the I/O unit 1120, the memory device 1130 and the interface unit 1140 may communicate with each other through the data bus 1150.

The controller 1110 may include at least one of a microprocessor, a digital signal processor, a microcontroller, or another logic device having a similar function to any one thereof. The memory device 1130 may store commands executed through the controller 1110. The I/O unit 1120 may receive data or signals from the outside of the system 1100 and/or may transmit data or signals to the outside of the system 1100.

The memory device 1130 may include at least one of the non-volatile memory devices according to embodiments described herein. Additionally, the memory device 1130 may further include a random access volatile memory device and/or at least one of various kinds of memory devices.

The interface unit 1140 may transmit data to a communication network and/or may receive data from a communication network.

Figure 39:
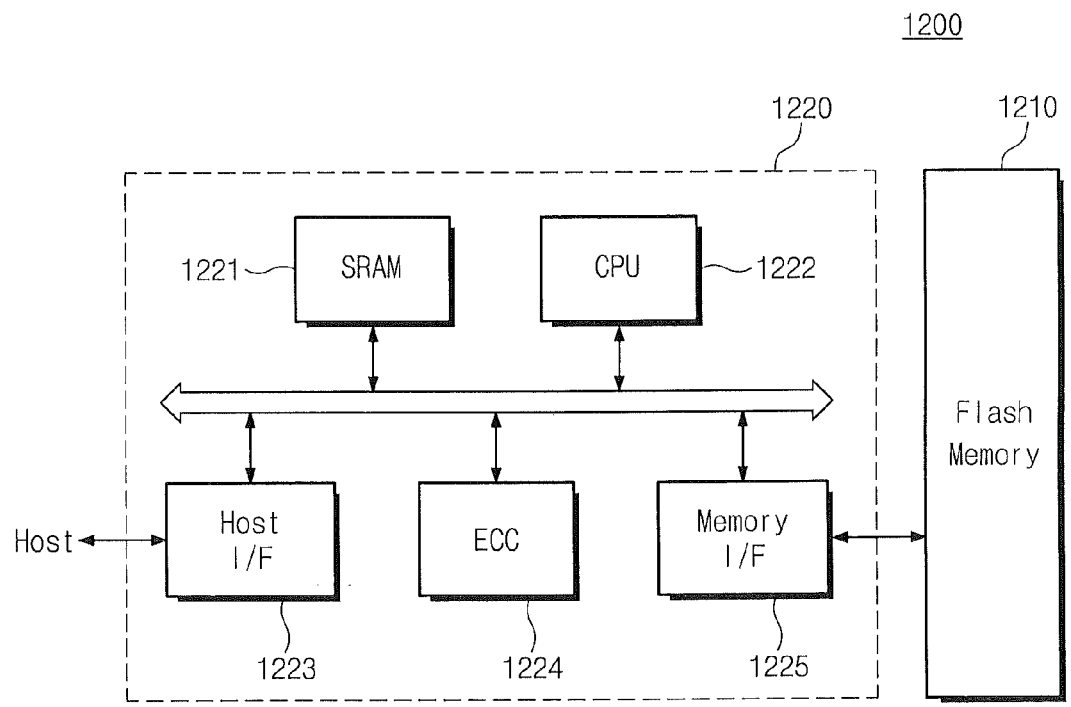
FIG. 39 is a schematic block diagram illustrating an example of memory cards including three-dimensional semiconductor devices according to some embodiments of the inventive concepts.

FIG. 39 is a schematic block diagram illustrating an example of memory cards including three-dimensional semiconductor devices according to some embodiments of the inventive concepts.

Referring to FIG. 39, a memory card 1200 for storing massive data may include a flash memory device 1210 according to some embodiments of the inventive concepts. The memory card 1200 according to the inventive concepts may include a memory controller 1220 that controls data communication between a host and the memory device 1210.

A static random access memory (SRAM) device 1221 may be used as an operation of a central processing unit (CPU) 1222. A host interface unit 1223 may be configured to include a data communication protocol between the memory card 1200 and the host. An error check and correction (ECC) block 1224 may detect and correct errors of data which are read out from the flash memory device 1210. A memory interface unit 1225 may interface with the flash memory device 1210 according to inventive concepts disclosed herein. The CPU 1222 may control overall operations for data exchange of the memory controller 1220. Even though not shown in the drawings, the memory card 1200 may further include a read only memory (ROM) device that stores code data to interface with the host.

The memory card 1200 may realized as solid state disks (SSD) which are used as hard disks of computer systems.

Figure 40:
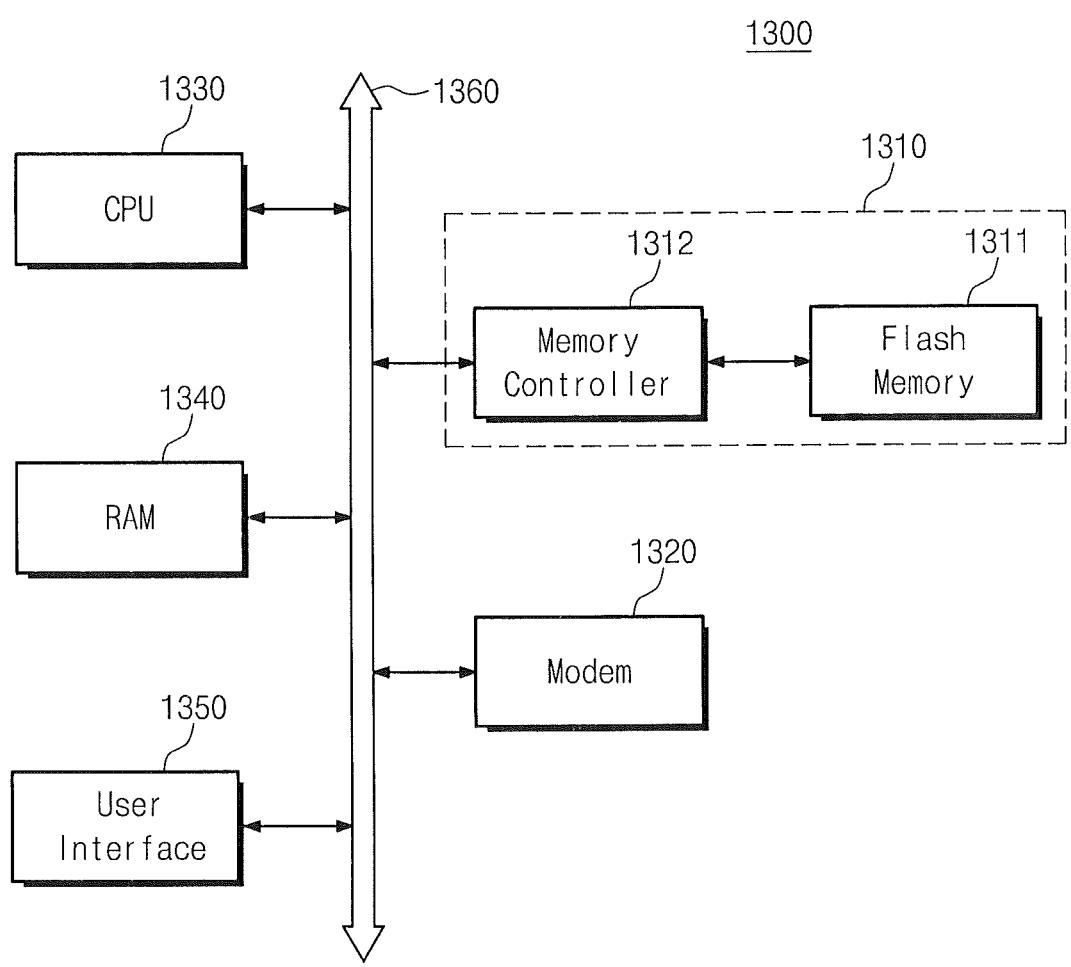
FIG. 40 is a schematic block diagram illustrating an example of information processing systems including three-dimensional semiconductor devices according to some embodiments of the inventive concepts.

FIG. 40 is a schematic block diagram illustrating an example of information processing systems including three-dimensional semiconductor devices according to some embodiments of the inventive concepts.

Referring to FIG. 40, a flash memory system 1310 according to the inventive concepts is installed in an information processing system 1300 such as a mobile device or a desk top computer. The information processing system 1300 according to the inventive concepts may include a modem 1320, a central processing unit (CPU) 1330, a random access memory (RAM) device 1340, and a user interface unit 1350 that are electrically connected to the flash memory system 1310 through a system bus 1360. The flash memory system 1310 may have a substantially same structure as the aforementioned memory system or flash memory system. The flash memory system 1310 may store data processed by the CPU 1330 or data inputted from an external system. The flash memory system 1310 may be realized as a solid state disk (SSD). In this case, the information processing system 1300 may stably and reliably store massive data in the flash memory system 1310. The increase in reliability enables the flash memory system 1310 to conserve resources for error correction, such that a high speed data exchange function may be provided to the information processing system 1300. Although not shown in the drawings, the information processing system 1300 may further include an application chipset, a camera image processor (CIS), and/or an input/output device.

Additionally, the semiconductor devices and the memory system according to the inventive concepts may be encapsulated using various packaging techniques. For example, the semiconductor devices and the memory system according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and/or a wafer-level processed stack package (WSP) technique.

In the semiconductor devices and the fabricating methods according to the inventive concepts, sub-stack structures having a predetermined height and active holes are repeatedly stacked. Thus, cell dispersion may be improved, and various errors (e.g., a not-open error caused in an etching process) may be prevented. Additionally, the grain size of the active pillar used as channels may be increased or maximized using the metal induced lateral crystallization method, so that the cell current may be improved. Furthermore, the formation position of a metal silicide layer including the crystallization inducing metal may be controlled such that the concentration grade of the crystallization inducing metal may be controlled depending on its position within the active pillar.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor device comprising:
a stack structure on a substrate, the stack structure including conductive lines and insulating layers that are alternately stacked;
an active pillar that penetrates the stack structure; and
a crystallization inducing metal doped in the active pillar,
wherein a doping concentration of the crystallization inducing metal in the active pillar varies depending on a height from a bottom surface of the active pillar,
wherein a sidewall of the active pillar is substantially non-linear,
wherein the active pillar comprises:
an active plug adjacent the substrate; and
an active shell having a hollow cup-shape on the active plug, and
wherein the doping concentration of the crystallization inducing metal at a bottom surface of the active shell is higher than the doping concentration of the crystallization inducing metal at a sidewall of the active shell.

2. A semiconductor device comprising:
a stack structure on a substrate;
an active pillar that penetrates the stack structure; and
a crystallization inducing metal doped in the active pillar,
wherein a doping concentration of the crystallization inducing metal in the active pillar varies depending on a height from a bottom surface of the active pillar, wherein the active pillar comprises:
an active plug adjacent the substrate; and
an active shell having a hollow cup-shape on the active plug, and
wherein the doping concentration of the crystallization inducing metal at a bottom surface of the active shell is higher than the doping concentration of the crystallization inducing metal at a sidewall of the active shell.

3. The semiconductor device of claim 2, wherein the active pillar further comprises a first active pad disposed on a top end of the active shell and having a disk-shaped plane.

4. The semiconductor device of claim 3, wherein the doping concentration of the crystallization inducing metal at a top surface of the first active pad is higher than the doping concentration of the crystallization inducing metal at the sidewall of the active shell.

5. The semiconductor device of claim 3, wherein the active pillar further comprises at least one second active pad disposed between the first active pad and the active plug.

6. The semiconductor device of claim 5, wherein the doping concentration of the crystallization inducing metal at an interface between the active shell and the second active pad is higher than the doping concentration of the crystallization inducing metal at the sidewall of the active shell.

7. The semiconductor device of claim 1, wherein the stack structure includes a plurality of sub-stack structures,
wherein each of the sub-stack structures includes the conductive layers and the insulating layers that are alternately stacked,
wherein the active pillar penetrates the sub-stack structures, and
wherein a sidewall of the active pillar adjacent an interface between the sub-stack structures is substantially non-linear.

8. The semiconductor device of claim 1, wherein the active pillar includes poly-silicon having a grain size of about 1 μm or more.

9. A semiconductor device comprising:
a plurality of sub-stack structures that are arranged sequentially on a substrate; and
an active pillar that penetrates the plurality of sub-stack structures and to contact the substrate, the active pillar comprising a crystallization inducing metal doped therein,
wherein a doping concentration of the crystallization inducing metal in the active pillar varies depending on a height from the substrate,
wherein the active pillar comprises an active plug adjacent the substrate, an active shell having a hollow cup-shape on the active plug, a first active pad on a top end of the active shell and having a disk-shaped plane, and at least one second active pad disposed between the first active pad and the active plug,
wherein the active plug is between the active shell and the substrate, and
wherein the doping concentration of the crystallization inducing metal at a bottom surface of the active shell is higher than the doping concentration of the crystallization inducing metal at a sidewall of the active shell.

10. The semiconductor device according to claim 9, wherein the doping concentration of the crystallization inducing metal at a top surface of the first active pad is higher than the doping concentration of the crystallization inducing metal at a sidewall of the active shell.

11. The semiconductor device according to claim 9, wherein the doping concentration of the crystallization inducing metal at an interface between the active shell and the second active pad is higher than the doping concentration of the crystallization inducing metal at a sidewall of the active shell.

12. The semiconductor device of claim 1, wherein the active pillar further comprises a first active pad disposed on a top end of the active shell and having a disk-shaped plane.

13. The semiconductor device of claim 12, wherein the doping concentration of the crystallization inducing metal at a top surface of the first active pad is higher than the doping concentration of the crystallization inducing metal at the sidewall of the active shell.

* * * * *